US007569900B2

(12) United States Patent

Imai et al.

(10) Patent No.: US 7,569,900 B2

(45) Date of Patent: Aug. 4, 2009

(54) SILICON CARBIDE HIGH BREAKDOWN VOLTAGE SEMICONDUCTOR DEVICE

(75) Inventors: Seiji Imai, Kawasaki (JP); Takashi Shinohe, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 105 days.

(21) Appl. No.: 11/272,858

(22) Filed: Nov. 15, 2005

(65) Prior Publication Data

US 2006/0102908 A1 May 18, 2006

(30) Foreign Application Priority Data

Nov. 16, 2004 (JP) ............................ 2004-331617

(51) Int. Cl.

*H01L 29/76* (2006.01)
*H01L 31/0312* (2006.01)
*H01L 21/336* (2006.01)

(52) U.S. Cl. ......................... 257/401; 257/77; 257/340; 257/E29.104; 438/284

(58) Field of Classification Search ................... 257/77, 257/E21.154, E29.104, E29.003, 44, 45, 257/341, 342, 401

See application file for complete search history.

(56) References Cited

U.S. PATENT DOCUMENTS

| | | | | |
|---|---|---|---|---|
| 5,322,802 | A * | 6/1994 | Baliga et al. | 438/268 |
| 5,950,076 | A * | 9/1999 | Baliga | 438/142 |
| 6,023,078 | A * | 2/2000 | Baliga | 257/122 |
| 6,075,259 | A * | 6/2000 | Baliga | 257/77 |
| 6,147,381 | A * | 11/2000 | Hirler et al. | 257/328 |
| 6,246,077 | B1 * | 6/2001 | Kobayashi et al. | 257/77 |
| 6,455,892 | B1 * | 9/2002 | Okuno et al. | 257/328 |
| 6,956,238 | B2 * | 10/2005 | Ryu et al. | 257/77 |

(Continued)

FOREIGN PATENT DOCUMENTS

| | | |
|---|---|---|
| JP | 2000-188399 | 7/2000 |
| JP | 2000188399 A * | 7/2000 |
| JP | 2003-309262 | 10/2003 |

OTHER PUBLICATIONS

Harada et al., 8.5-mΩ*cm2 600-V Double Epitaxial MOSFETs in 4H-SiC:, IEEE Electron Device Letters, vol. 25, No. 5, May 2004, pp. 292-294.*

(Continued)

*Primary Examiner*—Theresa T Doan
*Assistant Examiner*—Sarah K Salerno
(74) *Attorney, Agent, or Firm*—Oblon, Spivak, McClelland, Maier & Neustadt, P.C.

(57) ABSTRACT

A semiconductor device includes an SiC substrate, an SiC layer of a first conductivity type disposed on the upper surface of the SiC substrate, a first SiC region of a second conductivity type disposed on the SiC layer, a second SiC region of the first conductivity type disposed on a surface region of the first SiC region, including a nitrogen-added first sub-region and a phosphorus-added second sub-region disposed in contact with the first sub-region, a gate insulating film disposed to extend over the SiC layer, first SiC region, and first sub-region of the second SiC region, a gate electrode formed on the gate insulating film, a first electrode formed on the second sub-region of the second SiC region and the first SiC region, and a second electrode formed on the lower surface of the SiC substrate.

18 Claims, 17 Drawing Sheets

U.S. PATENT DOCUMENTS

| | | | | |
|---|---|---|---|---|
| 2002/0130325 | A1 * | 9/2002 | Alok | 257/77 |
| 2003/0107041 | A1 * | 6/2003 | Tanimoto et al. | 257/77 |
| 2003/0227052 | A1 * | 12/2003 | Ono et al. | 257/341 |
| 2004/0119076 | A1 * | 6/2004 | Ryu | 257/77 |
| 2004/0211980 | A1 * | 10/2004 | Ryu | 257/200 |
| 2006/0108589 | A1 * | 5/2006 | Fukuda et al. | 257/77 |
| 2006/0192256 | A1 * | 8/2006 | Cooper et al. | 257/401 |
| 2006/0255373 | A1 * | 11/2006 | Elpelt et al. | 257/256 |
| 2006/0270103 | A1 * | 11/2006 | Das et al. | 438/105 |

OTHER PUBLICATIONS

R. Kosugi, et al., "Fabrication of Double Implanted (0001) 4H-SiC MOSFETs by Using Pyrogenic Re-Oxidation Annealing", Materials Science Forum vols. 457-460 (2004), pp. 1397-1400.

Shinsuke Harada, et al., "8.5-mΩ * $cm^2$ 600-V Double-Epitaxial MOSFETs in 4H-SiC", IEEE Electron Device Letters, vol. 25, No. 5, May 2004, pp. 292-294.

* cited by examiner

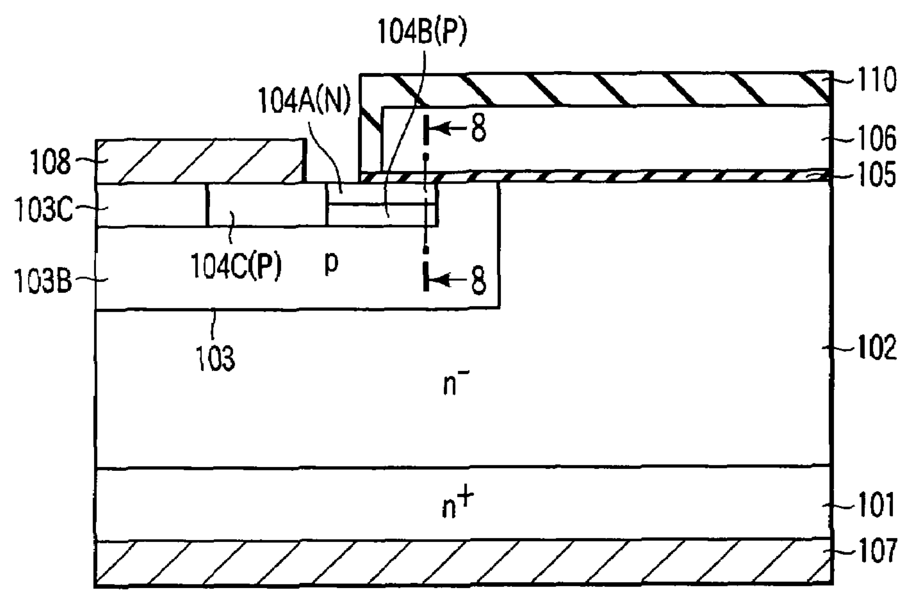
F I G. 1
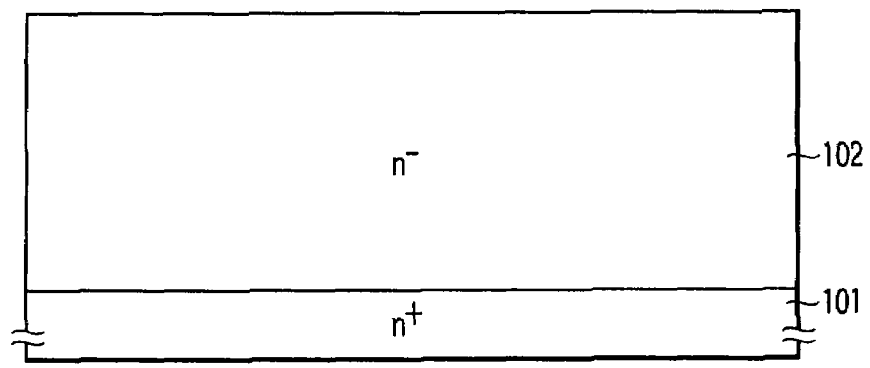
F I G. 2
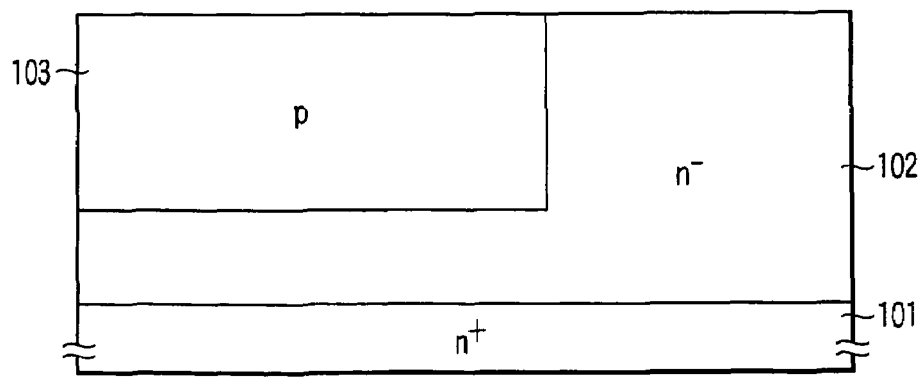
F I G. 3

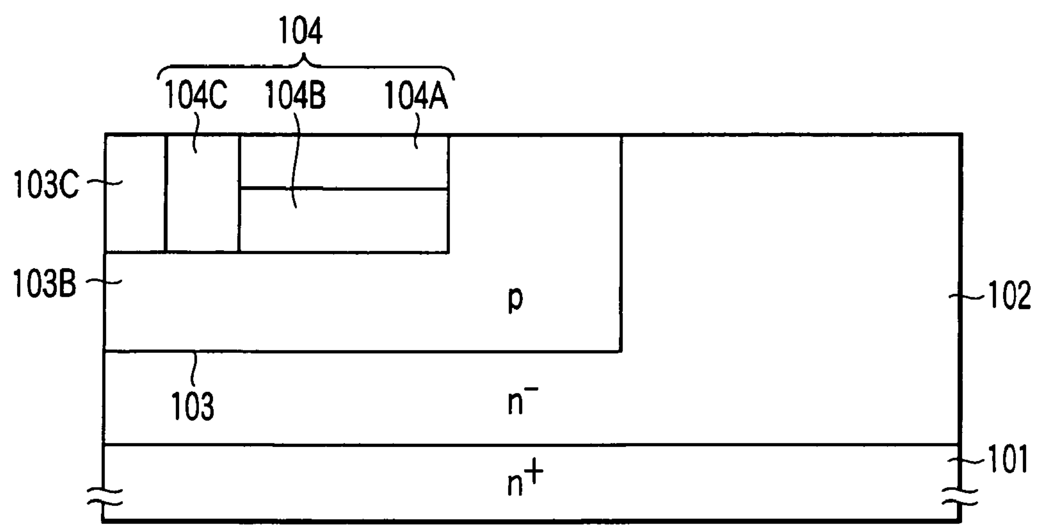
F I G. 4
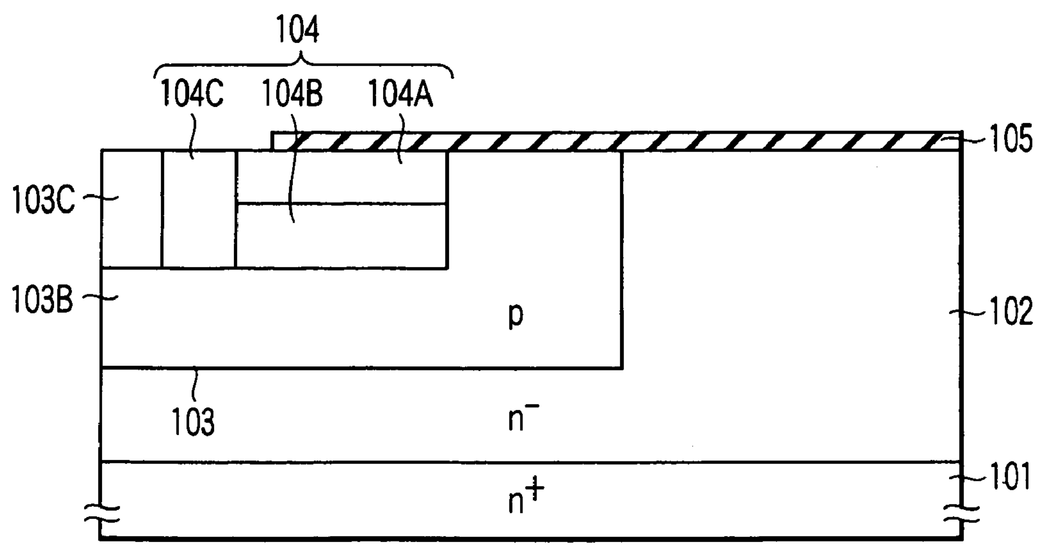
F I G. 5

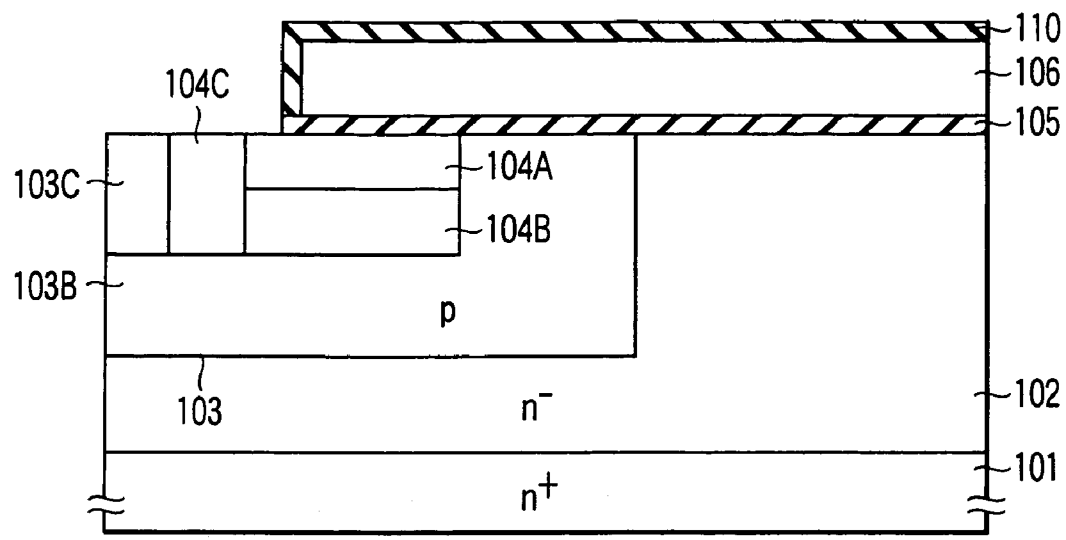
F I G. 6
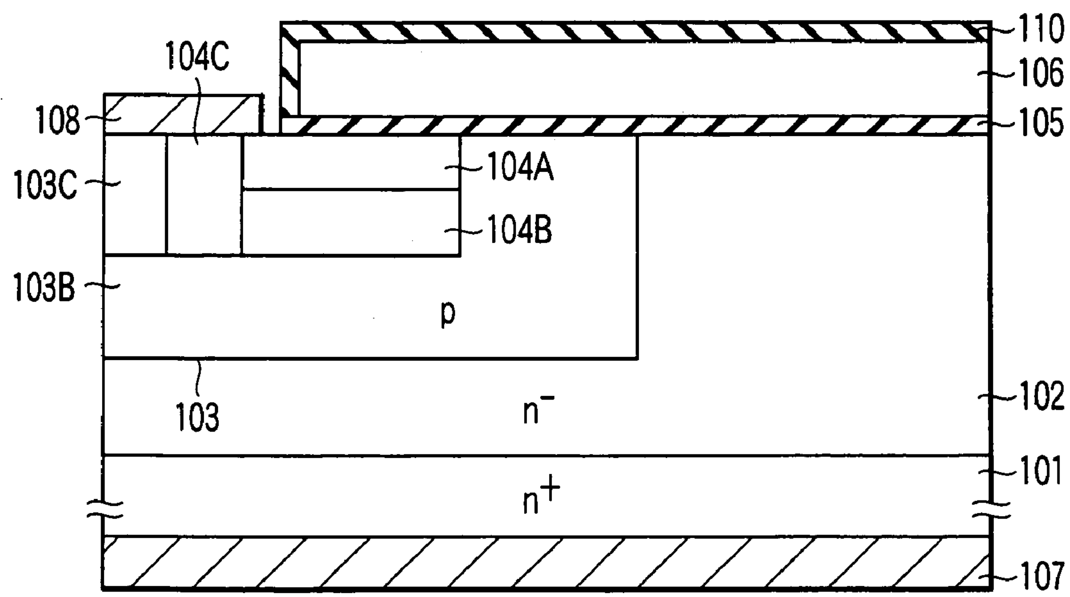
F I G. 7

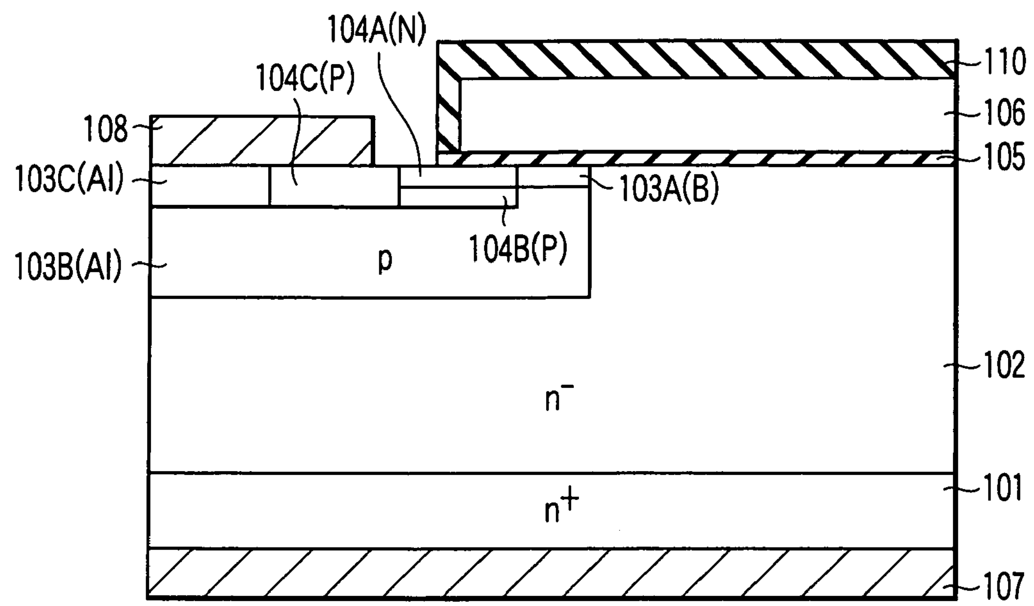
F I G. 1 0
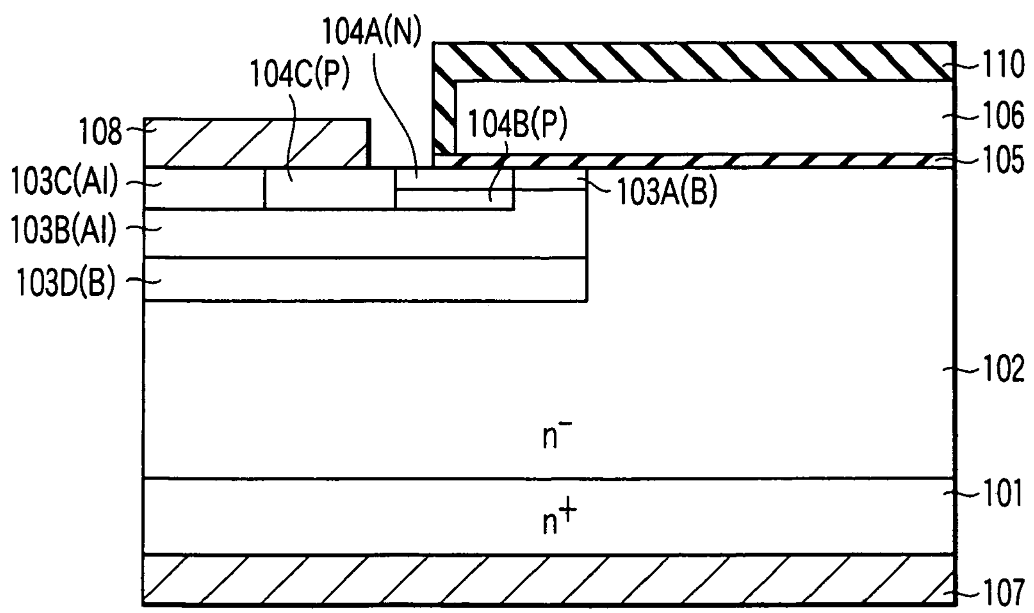
F I G. 1 1

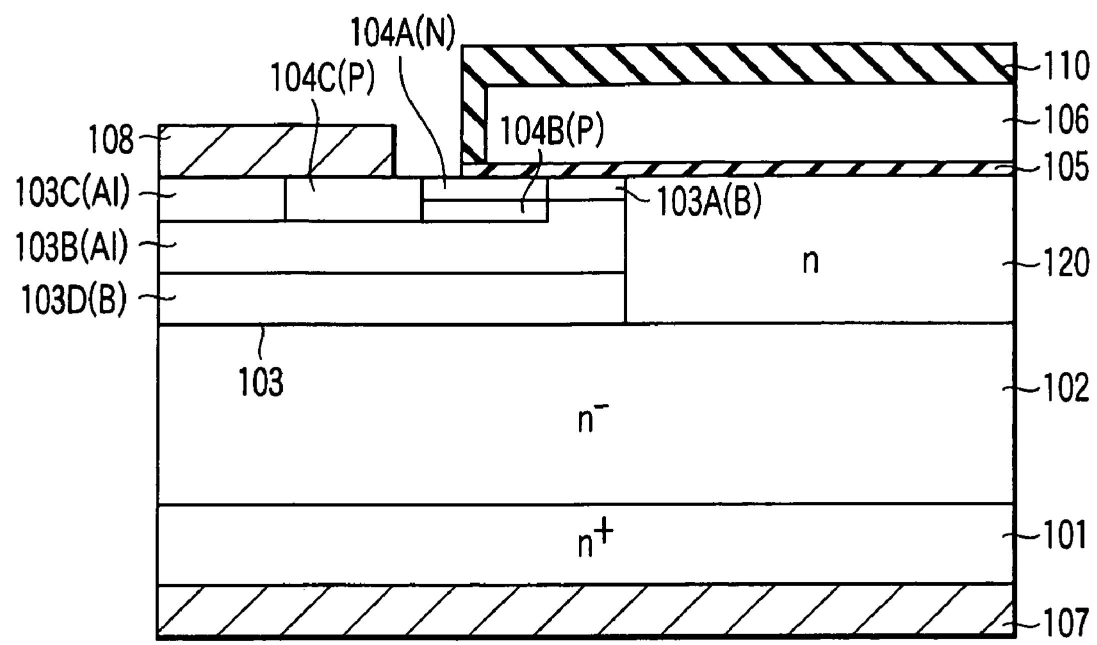
F I G. 1 2
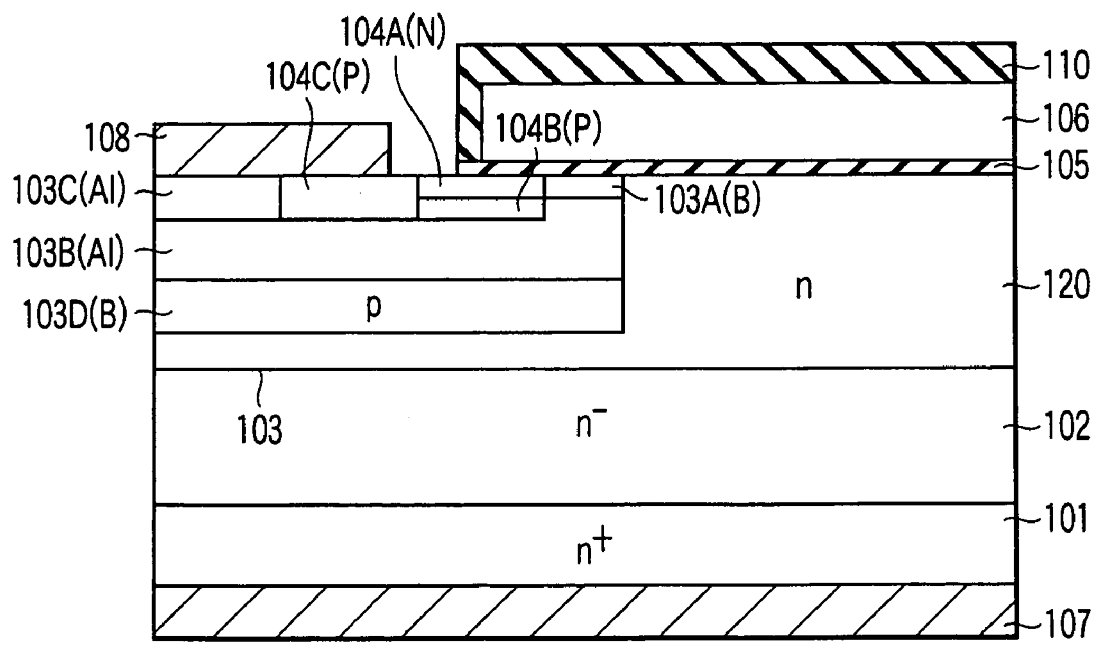
F I G. 1 3

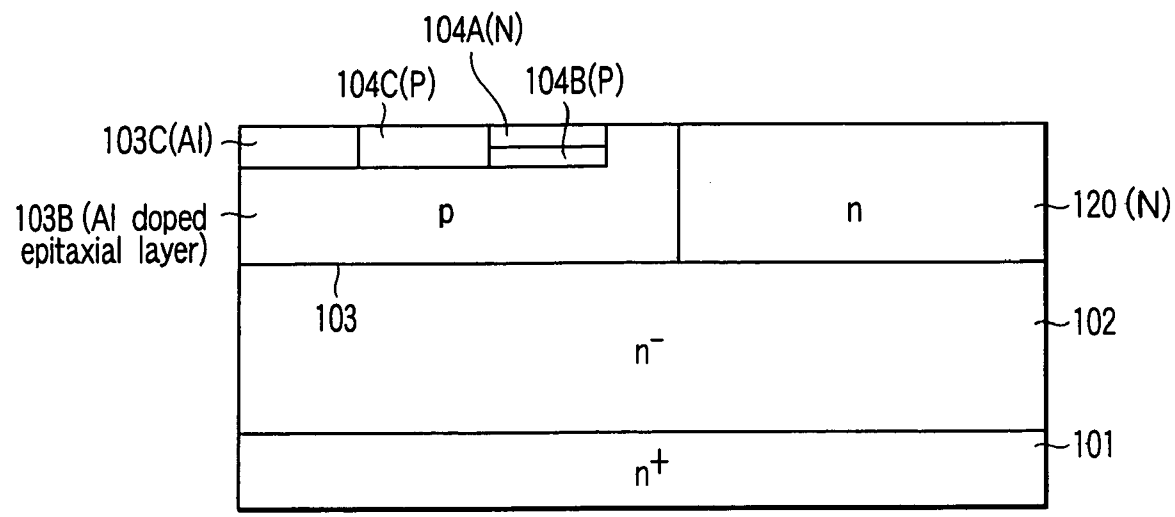
F I G. 1 7
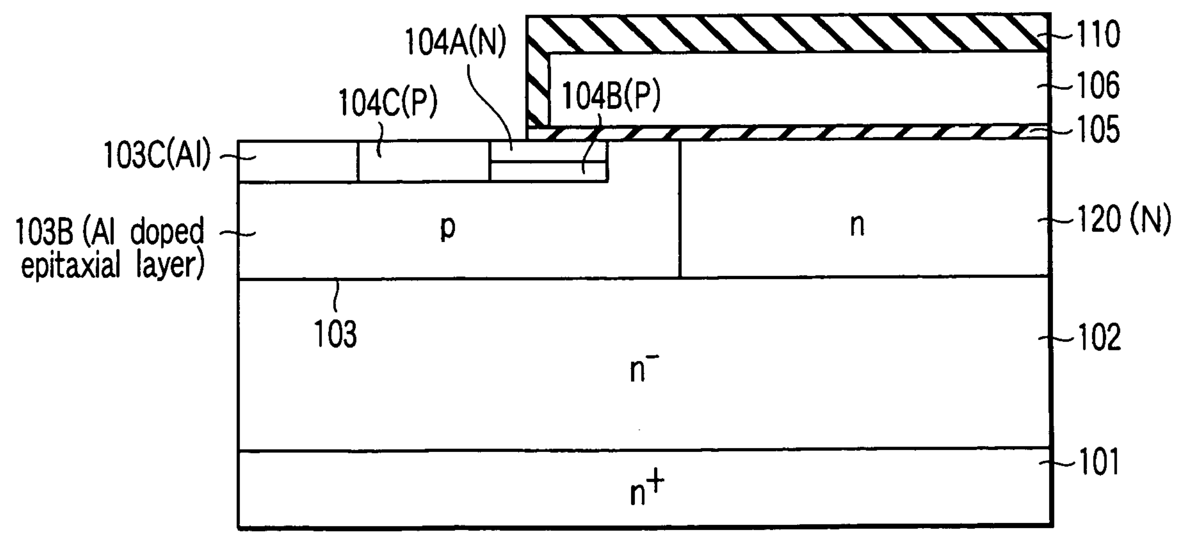
F I G. 1 8

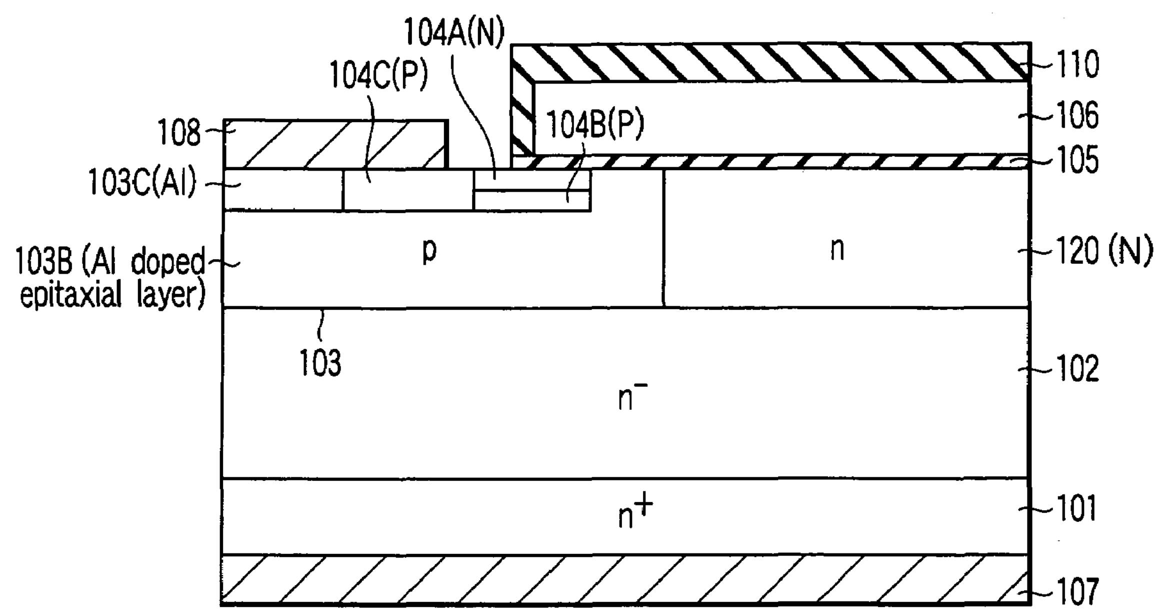
F I G. 1 9
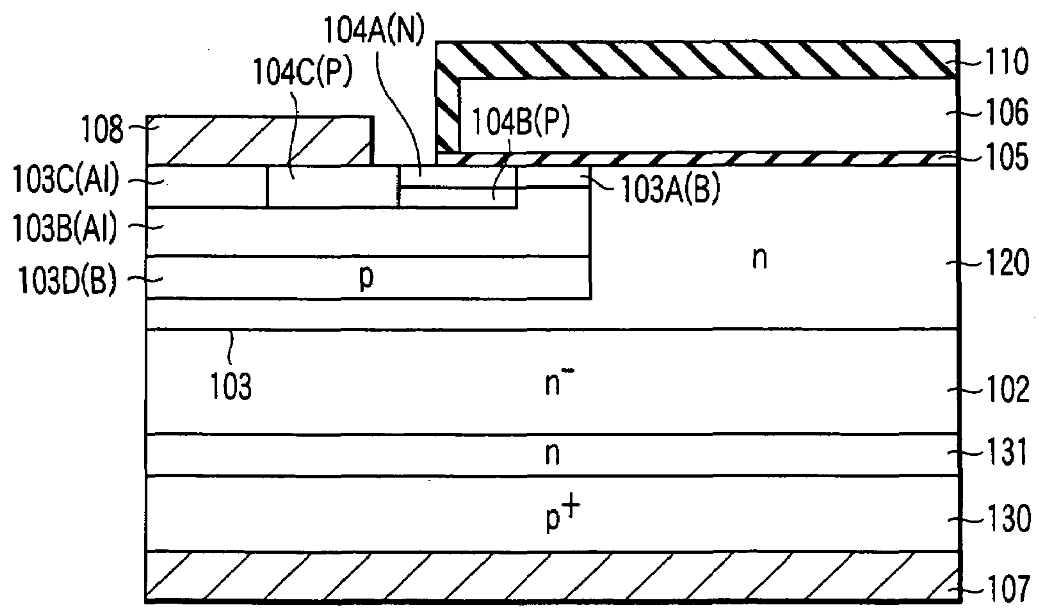
F I G. 2 0

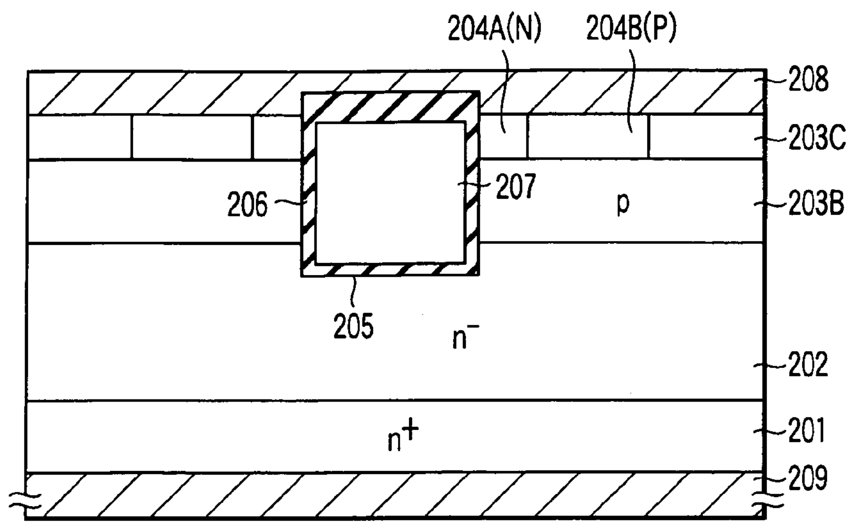
F I G. 2 1
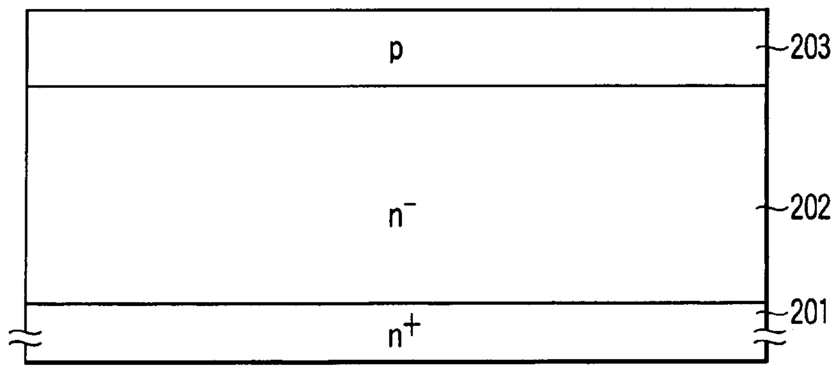
F I G. 2 2
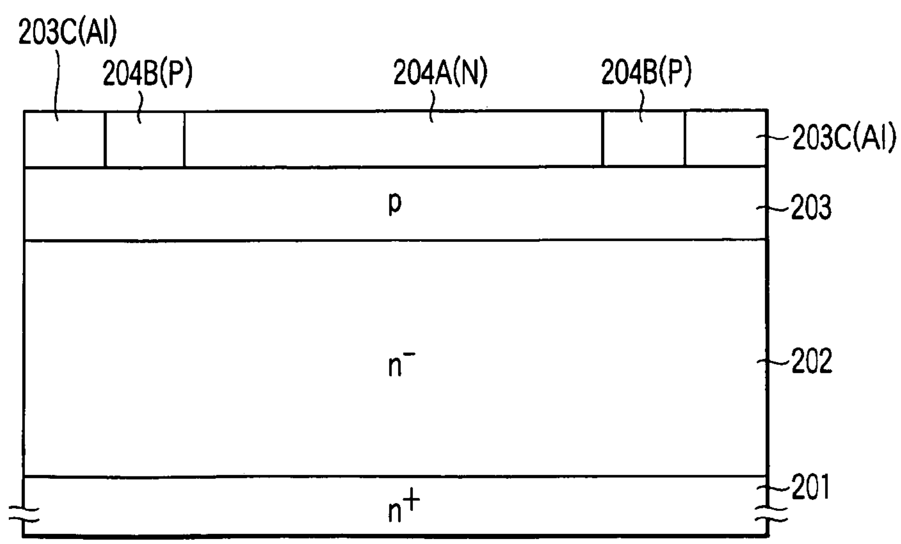
F I G. 2 3

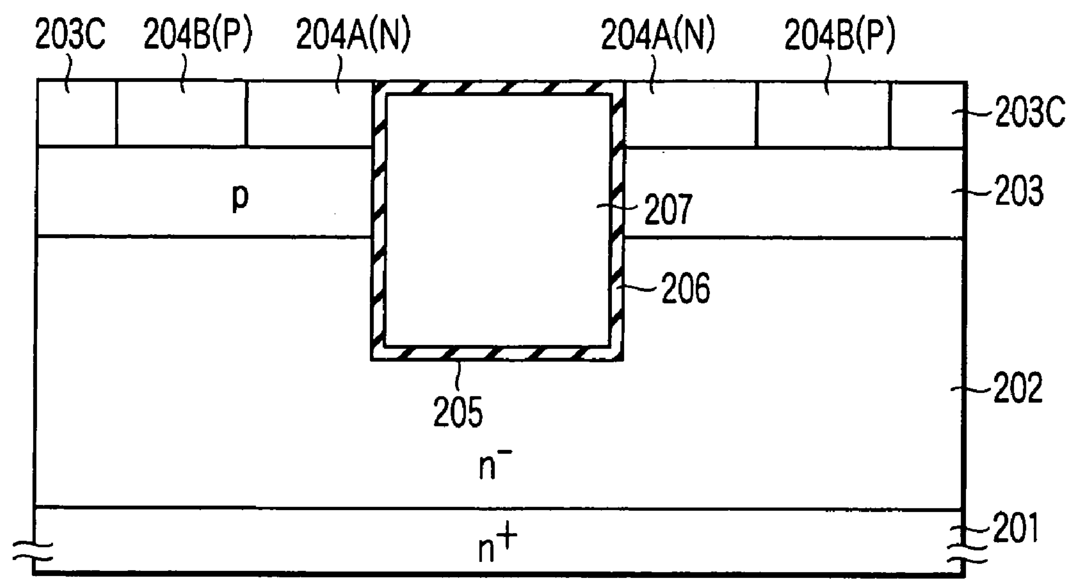
F I G. 2 4
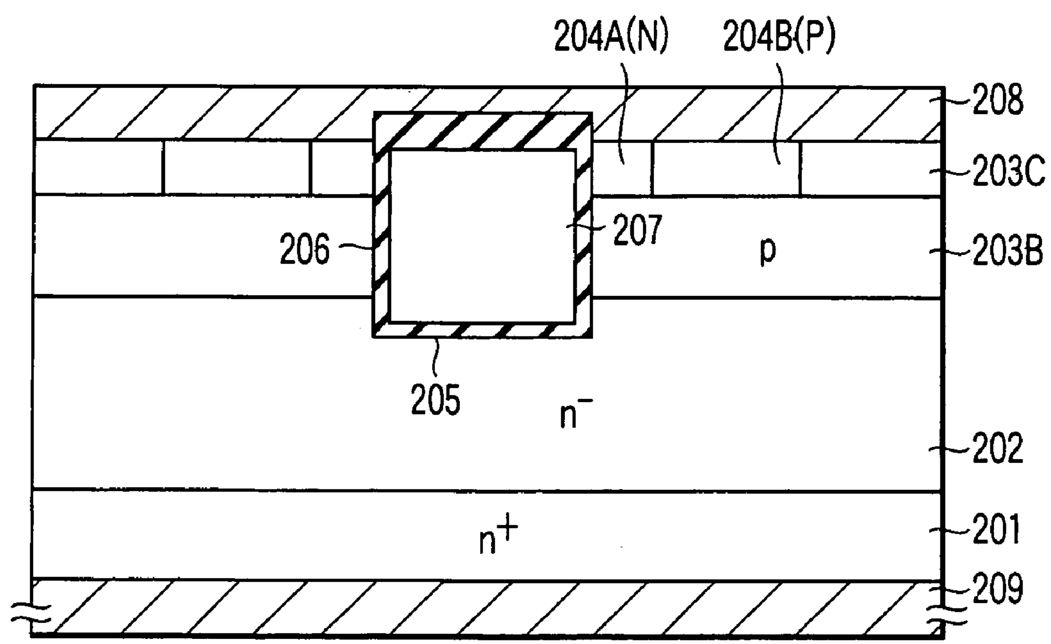
F I G. 2 5

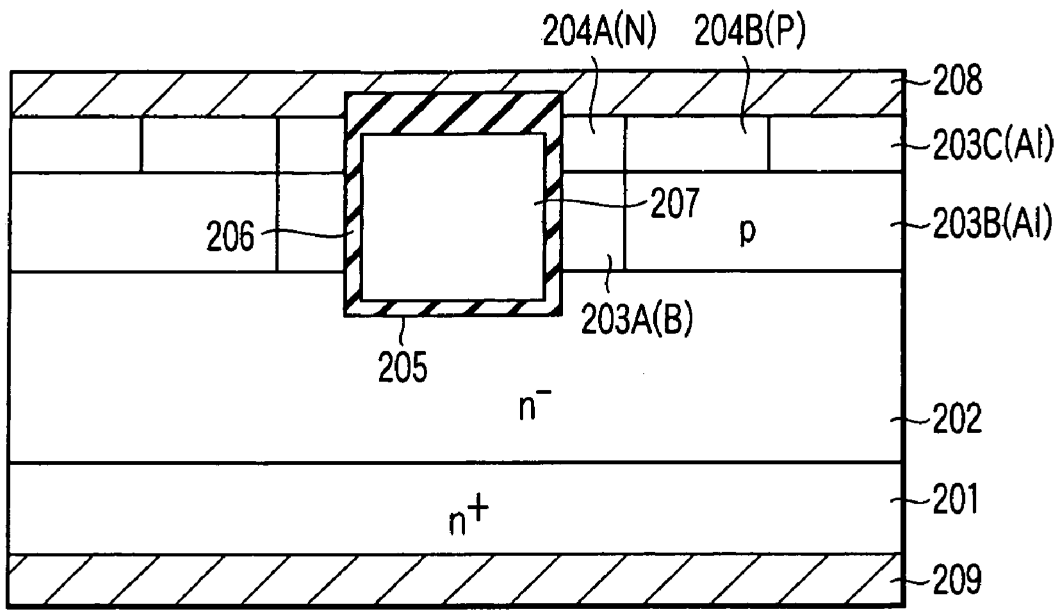
F I G. 2 6
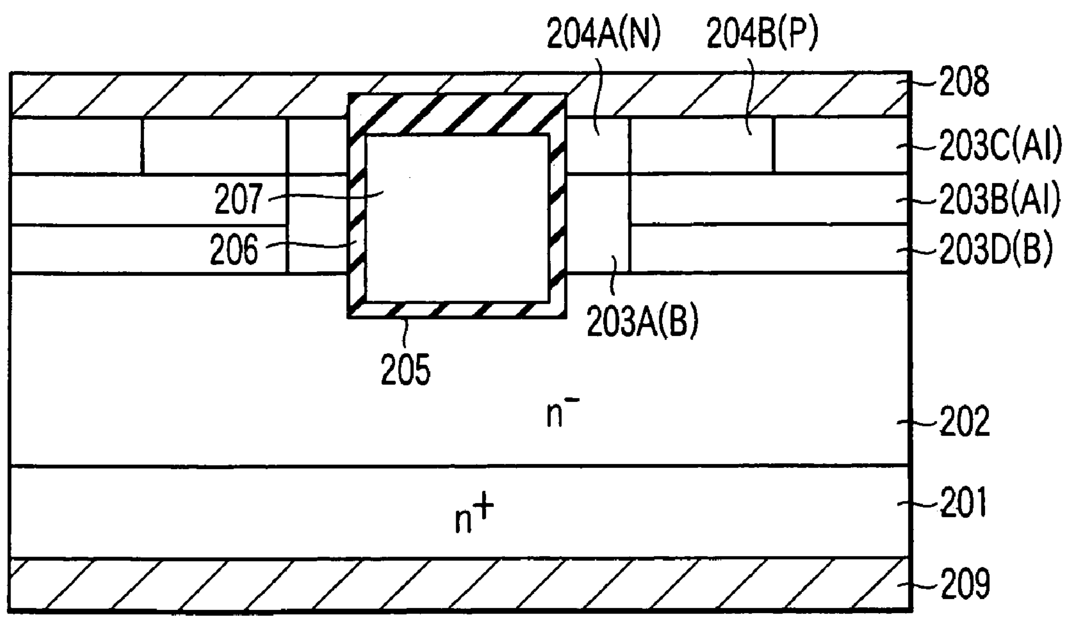
F I G. 2 7

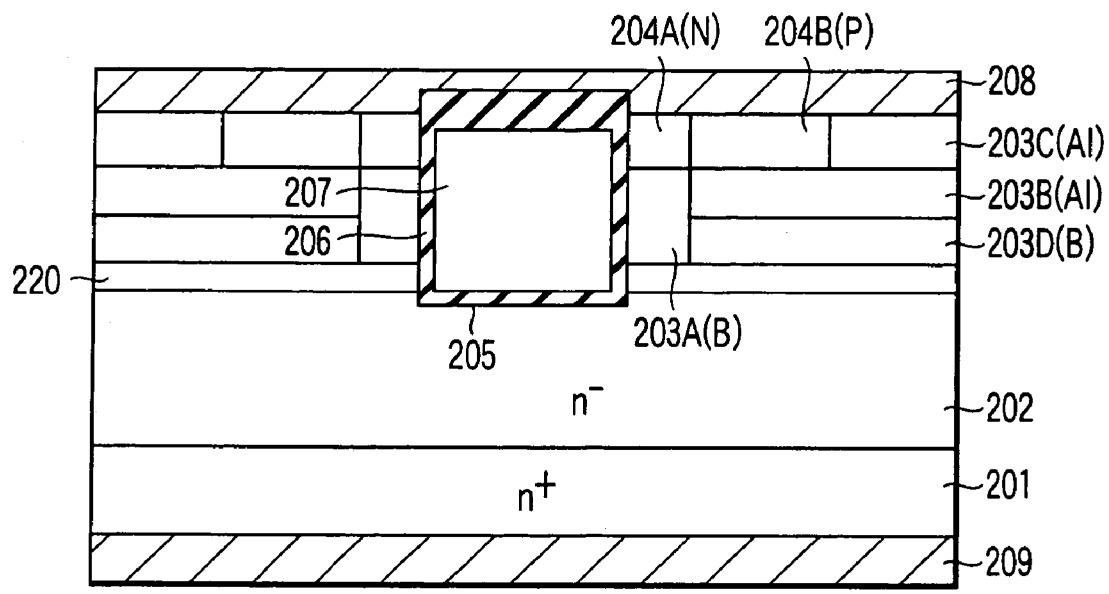
F I G. 3 2
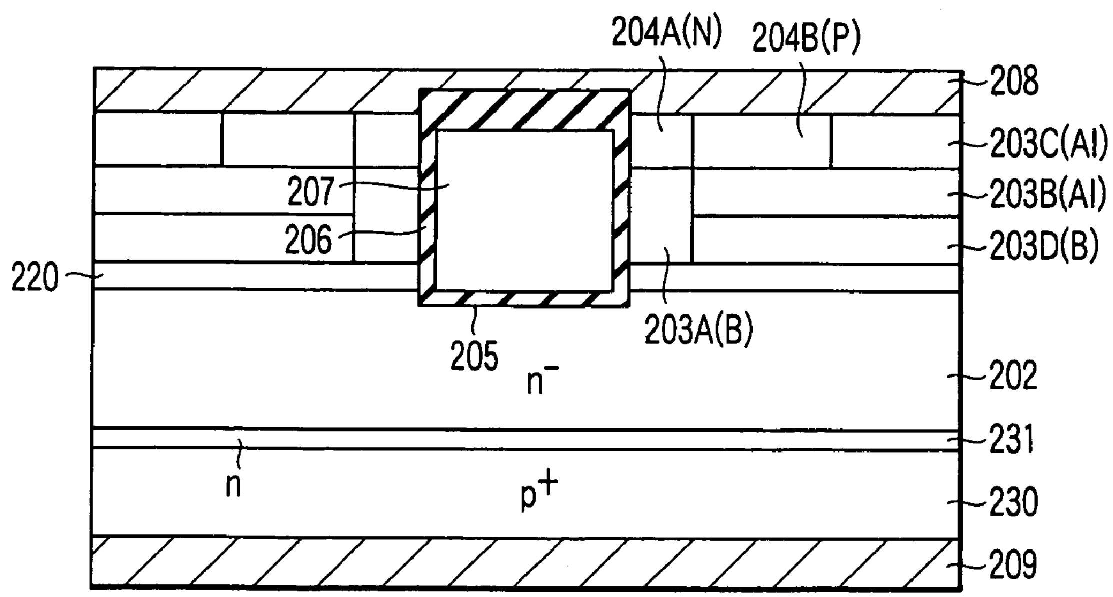
F I G. 3 3

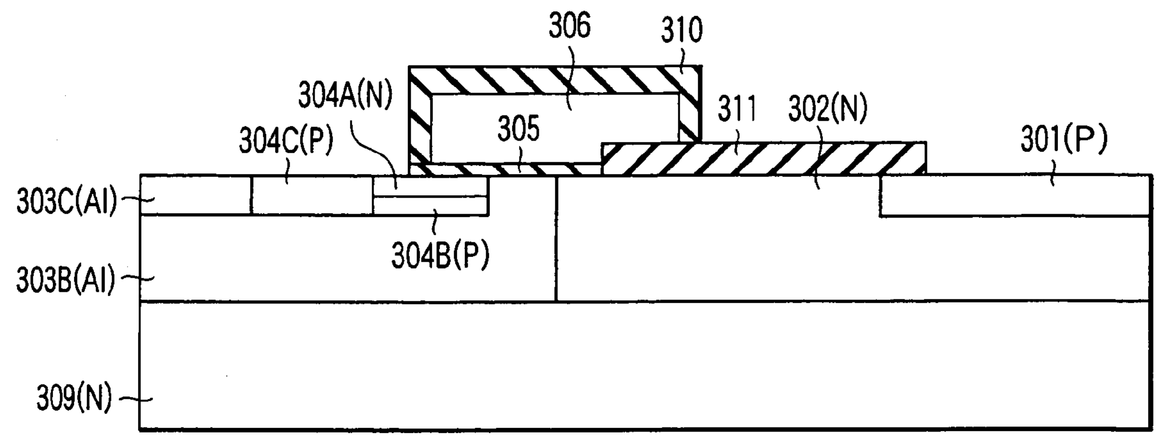
F I G. 37
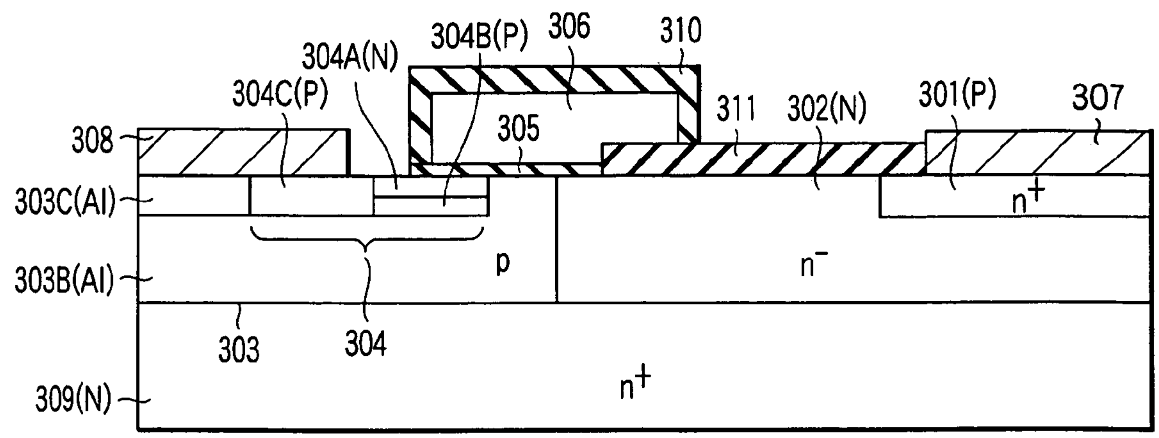
F I G. 38

SILICON CARBIDE HIGH BREAKDOWN VOLTAGE SEMICONDUCTOR DEVICE

CROSS-REFERENCE TO RELATED APPLICATIONS

This application is based upon and claims the benefit of priority from prior Japanese Patent Application No. 2004-331617, filed Nov. 16, 2004, the entire contents of which are incorporated herein by reference.

BACKGROUND OF THE INVENTION

1. Field of the Invention

The present invention relates to a semiconductor device, more particularly to a high-breakdown-voltage semiconductor device such as a MOSFET for power control, whose material is silicon carbide (SiC).

2. Description of the Related Art

As a power semiconductor device material of the next generation, SiC is expected to be used. As compared with Si, SiC has excellent physical properties in that the band gap is 3-fold, the intensity of breakdown electric field is about 10-fold, and the thermal conductivity is about 3-fold. When these properties are utilized, a power semiconductor device capable of operating at a high temperature with an ultra-lowloss can be realized.

There exist various types of high-breakdown-voltage semiconductor devices utilizing such SiC properties, but, for example, a double-implantation-MOSFET (DIMOSFET) is known in which a p-well and a source region are formed by ion implantation (see R. Kosugi et al., Materials Science Forum Vols. 457 to 460, pp. 1397-1400 [2004]). The DIMOSFET is easily manufactured, because a planar process is used in which a channel is formed by an ion implantation process with a satisfactory precision. Moreover, since gate driving is controlled by voltage, a power of a driving circuit can be reduced, and this element is a superior element suitable for a parallel operation.

However, the DIMOSFET has the following problem. An n-type source region of an SiC-DIMOSFET is usually formed, when phosphorus that easily lowers resistance is ion-implanted with a high dosage, and thereafter an activating thermal treatment is performed at about 1600° C. In this case, since phosphorus having a mass number of 31 and being comparatively heavy is ion-implanted on high dosage conditions, and the thermal treatment is performed at a high temperature of around 1600° C., an ion-implanted region of the SiC surface is badly damaged. As a result, a preferential sublimation phenomenon of Si occurs from the implanted region. Therefore, surface roughness of 10 nm or more is generated in the source region. Thereafter, when a gate insulating film is formed in such a manner as to range from the source region to a p-type base area by a thermal oxidation process, a CVD process or the like, the surface roughness of the source region is reflected as such also in the gate insulating film on the source region. As a result, electric long-term reliability of the gate insulating film is remarkably impaired.

To solve the above-described problem, there is reported a double epitaxial MOSFET (DEMOSFET) in which the p-type base area (well) is formed by an epitaxially grown film only (S. Harada et al., IEEE Electron Device Lett. 25, pp. 292-294 [2004]).

However, in the above-described method, the manufacturing process includes epitaxial growth requiring a long time. Therefore, there has been a demand for realization of a high-breakdown-voltage semiconductor device which obtains excellent performance having an ultra low on-resistance by use of an ion implantation technology capable of reducing step time, and SiC original physical properties and which can largely improve the long-term durability of the gate insulating film.

BRIEF SUMMARY OF THE INVENTION

According to a first aspect of the invention, there is provided a semiconductor device which comprises:

a silicon carbide substrate having a first main surface and a second main surface;

a silicon carbide layer of a first conductivity type disposed on the first main surface of the silicon carbide substrate;

a first silicon carbide region of a second conductivity type disposed on a surface of the silicon carbide layer;

a second silicon carbide region of the first conductivity type disposed on a surface region of the first silicon carbide region, and including a first sub-region to which nitrogen is added and a second sub-region which is disposed in such a manner as to come in contact with the first sub-region and to which phosphorus is added;

a gate insulating film disposed in such a manner as to extend over the silicon carbide layer, the first silicon carbide region, and the first sub-region of the second silicon carbide region above the first main surface of the silicon carbide substrate;

a gate electrode formed on the gate insulating film;

a first electrode formed on the second sub-region of the second silicon carbide region and the first silicon carbide region; and a second electrode formed on the second main surface of the silicon carbide substrate.

According to a second aspect of the invention, there is provided a semiconductor device which comprises:

a silicon carbide substrate having a first main surface and a second main surface;

a silicon carbide layer of a first conductivity type disposed on the first main surface of the silicon carbide substrate;

a first silicon carbide region of a second conductivity type disposed on the silicon carbide layer;

a second silicon carbide region of the first conductivity type disposed on the first silicon carbide region, and including a first sub-region to which nitrogen is added and a second sub-region which is formed in such a manner as to come into contact with the first sub-region and to which phosphorus is added;

a gate insulating film disposed in a trench which extends from the first sub-area through the first silicon carbide region to reach the silicon carbide layer;

a gate electrode disposed in the trench via the gate insulating film;

a first electrode disposed on the second sub-region and the first silicon carbide region; and a second electrode disposed on the second main surface of the silicon carbide substrate.

According to a third aspect of the invention, there is provided a semiconductor device, which comprises:

a silicon carbide substrate;

a first silicon carbide region of a second conductivity type disposed on an upper surface of the silicon carbide substrate;

a second silicon carbide region of a first conductivity type disposed on an upper surface region of the first silicon carbide region, and including a first sub-region to which nitrogen is added and a second sub-region which is disposed in such a manner as to come in contact with the first sub-region and to which phosphorus is added;

a third silicon carbide region of the first conductivity type disposed adjacent to and in contact with the first silicon carbide region on the upper surface of the silicon carbide substrate;

a fourth silicon carbide region disposed on an upper surface region of the third silicon carbide region in such a manner as to be apart from the first silicon carbide region;

a gate insulating film disposed in such a manner as to extend over the first silicon carbide region, the first sub-region of the second silicon carbide region, and the third silicon carbide region above the upper surface of the silicon carbide substrate;

a gate electrode disposed on the gate insulating film;

a first electrode disposed on the second sub-region of the second silicon carbide region and the first silicon carbide region; and a second electrode disposed on an upper surface of the fourth silicon carbide region.

BRIEF DESCRIPTION OF THE SEVERAL VIEWS OF THE DRAWING

FIG. 1 is a sectional view of a semiconductor device (DIMOSFET) according to a first embodiment of the present invention;

FIGS. 2 to 7 are sectional views showing manufacturing steps of the semiconductor device of the first embodiment in a stepwise manner;

FIG. 10 is a sectional view of the semiconductor device according to a first modification of the first embodiment;

FIG. 11 is a sectional view of the semiconductor device according to a second modification of the first embodiment;

FIG. 12 is a sectional view of the semiconductor device according to a third modification of the first embodiment;

FIG. 13 is a sectional view of the semiconductor device according to a fourth modification of the first embodiment;

FIGS. 15 to 19 are sectional views showing manufacturing steps of the semiconductor device of the fifth modification in the stepwise manner;

FIG. 20 is a sectional view of the semiconductor device (IGBT) according to a sixth modification of the first embodiment;

FIG. 21 is a sectional view of a semiconductor device (UMOSFET) according to a second embodiment of the present invention;

FIGS. 22 to 25 are diagrams showing manufacturing steps of the semiconductor device of the second embodiment in the stepwise manner;

FIG. 26 is a sectional view of the semiconductor device according to a first modification of the second embodiment;

FIG. 27 is a sectional view of the semiconductor device according to a second modification of the second embodiment;

FIGS. 29 to 32 are sectional views showing manufacturing steps of the semiconductor device of the third modification in the stepwise manner;

FIG. 33 is a sectional view of the semiconductor device (U-IGBT) according to a fourth modification of the second embodiment;

FIGS. 35 to 38 are sectional views showing manufacturing steps of the semiconductor device of the third embodiment in the stepwise manner.

DETAILED DESCRIPTION OF THE INVENTION

According to embodiments of the present invention described hereinafter, since surface roughness of a gate insulating film on a source region can be inhibited, it is possible to obtain a high-breakdown-voltage semiconductor device purely utilizing physical properties of SiC and having excellent performances with an ultra-low on-resistance, and reliability of the gate insulating film can be largely improved.

The embodiments of the present invention will be described hereinafter with reference to the drawings.

First Embodiment

FIG. 1 is a sectional view showing a configuration of a DIMOSFET according to a first embodiment of the present invention. In FIG. 1, an SiC layer ($n^-$ layer) 102 including an n-type impurity concentration of $5\times10^{15}$ to $2\times10^{16}/cm^3$ and having a thickness of about 5 to 10 μm is formed on a hexagonal SiC substrate ($n^+$ substrate) 101 including n-type impurities at an impurity concentration of about $5\times10^{18}$ to $1\times10^{19}/cm^3$. On a partial surface of the SiC layer 102, there is formed a first silicon carbide region 103 (p-type well) whose p-type impurity concentration is about $1\times10^{17}$ to $5\times10^{17}/cm^3$ and which exists in a region from the SiC layer 102 surface to a depth of 0.6 μm. This p-type well constitutes the p-type base area 103. It is to be noted that a combination of base sub-areas 103B and 103C is generically referred to as the p-type base area 103.

Figure 8:
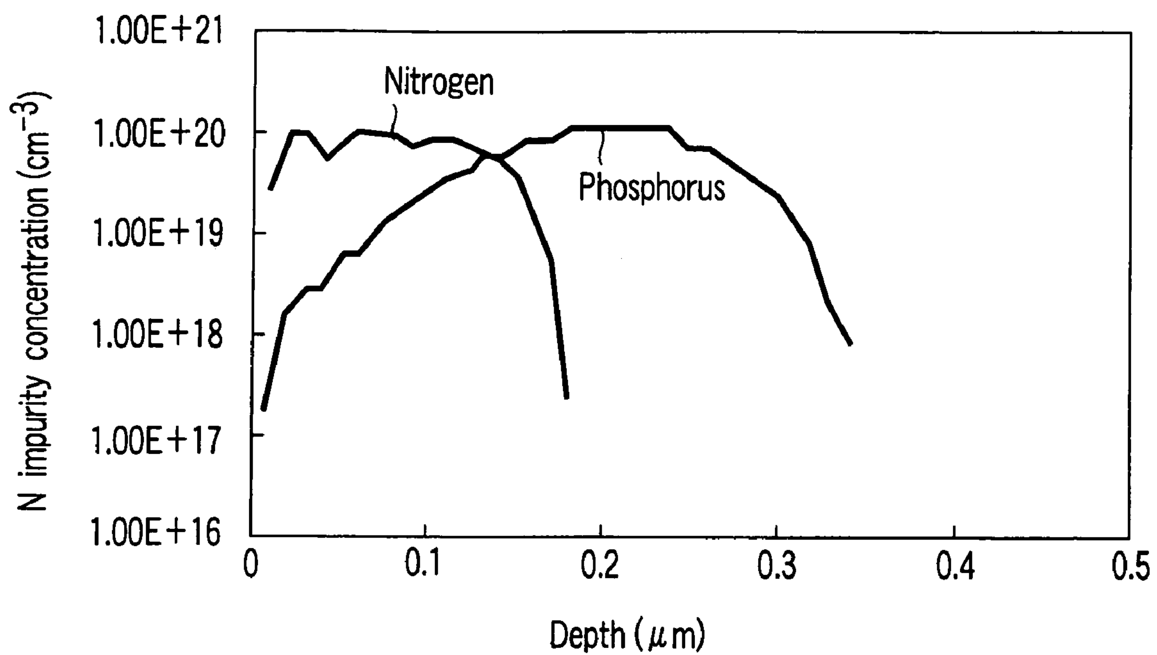
FIG. 8 shows an N-type impurity concentration distribution in a section along line 8-8 of FIG. 1.

Moreover, an n-type source region 104 (104A, 104B, 104C) is formed as a second silicon carbide region in this p-type base area 103. In more detail, the first source sub-region 104A containing nitrogen (N) as n-type impurities in a range of about $1\times10^{18}$ to $1\times10^{20}/cm^3$ exists in a region from the SiC layer 102 surface to a depth of 0.15 μm. Under the first source sub-region 104A, a third (second described later) source sub-region 104B containing about $1\times10^{20}/cm^3$ of phosphorus (P) as n-type impurities exists in a region from a bottom portion of the first source sub-region 104A to a depth of 0.15 μm. FIG. 8 shows an N-type impurity concentration distribution in a depth direction in a section along line 8-8 of FIG. 1.

In a side portion of the first source sub-region 104A, the second sub-region 104C containing about $1\times10^{20}/cm^3$ of phosphorus (P) as the n-type impurities exists in a region from the SiC layer 102 surface to a depth of 0.3 μm. These first sub-region 104A, the second sub-region 104C, and the third sub-region 104B constitute the source region 104 of a MOSFET. A source electrode 108 made of Ni is formed on the surface of the second sub-region 104C and the base sub-area 103C.

A gate insulating film 105 having a thickness of about 80 nm is formed in such a manner as to extend over the surface of the SiC layer 102 including the first source sub-region 104A and the base sub-area 103B. A gate electrode 106 made of polysilicon is formed on this gate insulating film 105.

As described above, according to the semiconductor device of the first embodiment, since nitrogen (N) having a small mass number is added as the n-type impurity to the first source sub-region 104A brought into direct contact with the gate insulating film 105, the surface of the first source sub-region 104A can be inhibited from being roughened in an interface between the first source sub-region 104A and the gate insulating film 105 with a high-temperature treatment at around 1600° C. A surface roughness is 10 nm root mean square (RMS) or less, a flat and dense gate insulating film can be realized as a whole, and reliability of the gate insulating film can be greatly improved.

Figure 9:
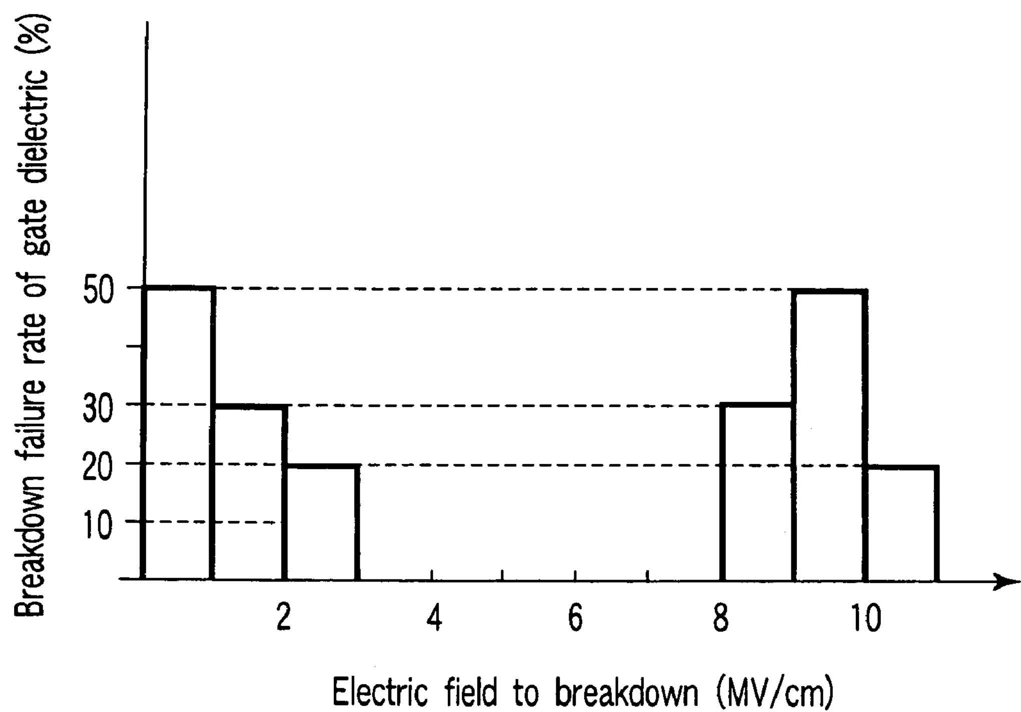
FIG. 9 is a histogram of a gate insulating breakdown voltage of a conventional DIMOSFET.

Specifically, in a case where the source region brought into direct contact with the gate insulating film is formed of phosphorus having a large mass number as in a prior art, as shown in FIG. 9, defective elements having a distribution of 0 to 3 MV/cm in a histogram of gate dielectric breakdown exist in a mixed manner owing to an influence of implantation damage. On the other hand, in a case where the region is made of nitrogen having a small mass number, the above-described defective elements are inhibited from being generated, the implantation damage is largely reduced, and the histogram of the gate dielectric breakdown is distributed only in a range of 8 to 11 MV/cm. It is possible to obtain the reliability of an excellent gate insulating film.

Next, a method of manufacturing the semiconductor device will be described with reference to FIGS. 2 to 7. First, as shown in FIG. 2, the high-resistance SiC layer 102 is successively formed on the low-resistance SiC substrate 101 by an epitaxial growth process. The SiC substrate contains nitrogen as the n-type impurity in an impurity concentration of $1\times10^{19}/cm^3$, has a thickness of 300 μm, and has hexagonal crystal gratings. The SiC layer contains nitrogen (N) as the n-type impurity in an impurity concentration of $5\times10^{15}/cm^3$, and has a thickness of 10 μm. Additionally, nitrogen (N) is used as the n-type impurity here, but other impurity such as phosphorus (P) may be used. Moreover, nitrogen and phosphorus may be used at the same time. Next, a silicon oxide film (not shown) is formed on the surface of the SiC layer 102.

Next, the surface of the silicon oxide film (not shown) is spin-coated with a resist (not shown), and the resist is patterned by a photolithography technology. The silicon oxide film is etched by anisotropic etching such as RIE using the patterned resist as an etching mask.

Accordingly, an ion implantation mask (not shown) of an ion implantation step described later is formed. Via this ion implantation mask, $^{27}Al^+$ is selectively ion-implanted with respect to the SiC layer 102. In this case, $^{27}Al^+$ is implanted on conditions that a substrate temperature is $T_{sub}$=room temperature to 500° C., acceleration energy at room temperature is Eacc=350 keV, and a total dosage is $\Phi=1\times10^{14}/cm^2$. As a result, as shown in FIG. 3, the base area 103 containing p-type impurities is formed in a region from the surface to a depth of 0.6 μm.

Next, as shown in FIG. 4, the source region 104 is selectively formed in the base area 103 by ion implantation. Specifically, in a deep portion (third source sub-region 104B) of the source region under a gate insulating film forming region, phosphorus (P) is ion-implanted in a state in which the substrate is heated at a temperature of about 500° C. and on conditions that acceleration energy is in a range of 150 to 250 keV, and the total dosage is $1.7\times10^{15}/cm^2$. Subsequently, in a shallow portion (first source sub-region 104A), nitrogen (N) is ion-implanted on conditions that the acceleration energy is in a range of 10 to 70 keV, and the total dosage is $1.2\times10^{15}/cm^2$. In this case, the impurity concentration distribution in a direction along line 8-8 of FIG. 1 is shown in FIG. 8 as described above.

In each region other than the first source sub-region 104A and the third source sub-region 104B in the source region 104, phosphorus is selectively ion-implanted in multiple stages at a substrate temperature of about 500° C. on conditions that acceleration energy is in a range of 10 to 250 keV, and the total dosage is $5\times10^{15}/cm^2$. As a result, the second sub-region 104C having an impurity concentration of $1\times10^{20}/cm^3$ is formed in a region from the surface to a depth of about 0.3 μm. Al is selectively ion-implanted to form a highly-doped base sub-area 103C. Thereafter, implanted impurities are activated by a thermal treatment at about 1600° C.

Next, as shown in FIG. 5, the gate insulating film 105 is selectively formed in such a manner as to extend over the SiC layer 102, the base area 103, and the first source sub-region 104A of the source region 104 by a thermal oxidation process, a CVD process, or the like. In this case, nitrogen (N) having a small mass number is added as the n-type impurity to the first source sub-region 104A brought into direct contact with the gate insulating film 105. Accordingly, since the surface is inhibited from being roughened by the treatment at the high temperature, the flat and dense gate insulating film 105 can be formed on the first source sub-region 104A, and long-term reliability of the gate insulating film 105 can be largely improved.

Moreover, as shown in FIG. 6, a polysilicon layer is formed on the gate insulating film 105 by the CVD process, and the polysilicon layer is patterned by the RIE process to thereby form the gate electrode 106. Thereafter, on the surface of the gate electrode 106, a silicon oxide film 110 is formed by the surface oxidation and CVD.

Next, the whole surface of the SiC substrate 101 is covered with the resist (not shown), and a thin oxide film present on the back surface of the SiC substrate 101 is etched with a diluted hydrofluoric acid (HF), buffer HF or the like. Next, as shown in FIG. 7, an Ni film is evaporated in a thickness of about 1 μm on the back surface of the SiC substrate 101 to form a drain electrode 107. Thereafter, the source electrode 108 of the Ni film is selectively formed on the source region 104 by an evaporation process accompanying lift-off step. Finally, a sinter treatment is performed at 950° C. for about five minutes, and an ohmic contact between the source electrode 108 and the drain electrode 107 is set to be satisfactory. As described above, the DIMOSFET of the first embodiment is completed.

In the DIMOSFET manufactured as described above, nitrogen having a small mass number is added as the n-type impurity to the corresponding place of the source region brought into direct contact with the gate insulating film. Accordingly, the surface of the source region is inhibited from being roughened in the treatment at the high temperature of around 1600° C., the flat and dense gate insulating film can be realized on the region, and the reliability of the gate insulating film can be largely improved. Specifically, in a case where the source region brought into direct contact with the gate insulating film is made of phosphorus having a large mass number as shown in FIG. 9, defective articles whose histogram of the gate dielectric breakdown is distributed in 0 to 3 MV/cm are generated by the influence of the implantation damages. On the other hand, in a case where the region is made of nitrogen having a small mass number in the present invention, the implantation damages are largely reduced, and the above-described defective articles are inhibited from being generated. As a result, the histogram of the gate dielectric breakdown is distributed only in 8 to 11 MV/cm, and it is possible to obtain the reliability of the excellent gate insulating film.

Next, a modification of the first embodiment will be described. FIG. 10 shows a first modification in which the base sub-area 103A of the p-type base region 103 which is in contact with the gate insulating film 105 is formed by ion-implanting boron (B) into the base sub-area 103A. In the base area 103, Al is ion-implanted into the sub-areas 103B, 103C as described above, but B having a mass number smaller than that of Al is implanted into the sub-area 103A. Accordingly, surface roughness of an interface between the base area 103 and a gate insulating film 105 can be reduced. Since a source region 104 is the same as that of the first embodiment, in addition to the effect of the first embodiment, an effect can be produced that the surface roughness of the base area can be reduced. Further, the gate threshold voltage of the MOSFET can be set to a predetermined value by adjusting the impurity concentration of the sub-area 103A(B).

FIG. 11 shows a second modification of the first embodiment. In the modification, a sub-area 103D of a bottom portion of a p-type base area 103B is formed by ion implantation of B. An atom radius of B is smaller than that of Al, and remaining defects after introduction by ion implantation and annealing at a high temperature are reduced as compared with Al. Therefore, in the present modification in which B is used in a portion forming main junction, leakage current can be reduced more.

Furthermore, since B is diffused into the SiC layer during high-temperature annealing, the impurity concentration around the main junction is reduced less than that of the ion-implanted region. As a result, a depletion layer extends into the inside of the p-type base region 103, the electric field intensity of the main junction edge is reduced, and the high breakdown voltage can be maintained.

On the other hand, by forming the sub-area 103B with Al whose impurity level is lower than that of B and whose charge/discharge time constant is small, there can be restrained a dynamic punch-through phenomenon, in which a depletion layer widely spreads into the inside of the p-type base layer 103, when a reverse voltage is abruptly applied to the device, and an unexpected turn-on of the device can be avoided. Further, an addition of a sub-area formed with B in the right hand of the base region 103 can reduce the remnant defects in all the regions of the main junction, with the result that the leakage current can be further reduced.

FIG. 12 shows a third modification of the first embodiment. In the modification, under a gate electrode 106, a portion disposed parallel to a p-type base area 103 is formed into an n-type third silicon carbide region 120 whose n-type impurity concentration is higher than that of a low-concentration SiC layer 102.

In the configuration of FIG. 12, on the lightly-doped SiC layer 102, an n-type layer to be the third silicon carbide region 120 is formed by epitaxial growth or ion implantation of nitrogen (N). Thereafter, the p-type base region 103 and source region 104 are similarly formed as in the first embodiment or its modifications. When the third silicon carbide region 120 is formed by ion implantation, the use of N whose mass number is small as an n-type impurity can reduce the surface roughness at the finish of the ion implantation and high temperature annealing, and the flat and dense gate insulating film 105 can be formed on the third silicon carbide region 120.

When B is used in an area 103A where an inversion channel layer is to be formed, B is diffused in a lateral direction during performing of activation annealing. Therefore, a channel length increases, and on-resistance increases. When the n-type third silicon carbide region 120 is formed beforehand in a portion where B is to be diffused, the junction does not move in a lateral direction, even if B is diffused in the lateral direction. Therefore, the increase of the channel length can be minimized. Further, when a sub-area formed with B is added on the right hand of the base region 103, the lateral diffusion is prevented, so that the JFET resistance can be prevented from increasing.

Moreover, in the embodiment, only half of the gate electrode 106 is shown for the sake of simplification of the drawing, but in actual, a symmetric portion exists on the right side of the drawing. For example, in FIG. 10, an upper portion of the low-concentration SiC layer 102 is sandwiched between the p-type base areas 103. Since the area sandwiched between the adjacent p-type base layers 103 is formed with a low-concentration n-type layer, and the area is narrowed by miniaturization, the area constitutes a resistance component with respect to a conducted electron. In the third modification, since the n-type third silicon carbide region 120 having a comparatively high n-type impurity concentration is formed in this portion, so-called JFET resistance is reduced. The n-type impurity concentration of the third silicon carbide region 120 is selected in a range in which a breakdown voltage does not drop.

FIG. 13 is a sectional view of a fourth modification of the first embodiment. The fourth modification is different from the third modification in that a third silicon carbide region 120 is interposed between a bottom surface of a base area 103 and an SiC layer 102. In this configuration, the electrons injected into the third silicon carbide layer 120 via the inversion layer channel formed over the surfaces of the source region 104 and base sub-area 103A spreads under the base region 103 through said interposing portion, and current flows uniformly through the whole portion of the device, and low on resistance can be realized. The third SiC region 120 is formed in a similar manner as in the third modification. It is to be noted that even in FIG. 13, a p-type area 103D(B) may be 103D(Al). In that case, a portion of the third silicon carbide region 103 formed under the p-type base area 103 has a function of preventing diffusion of B.

Figure 14:
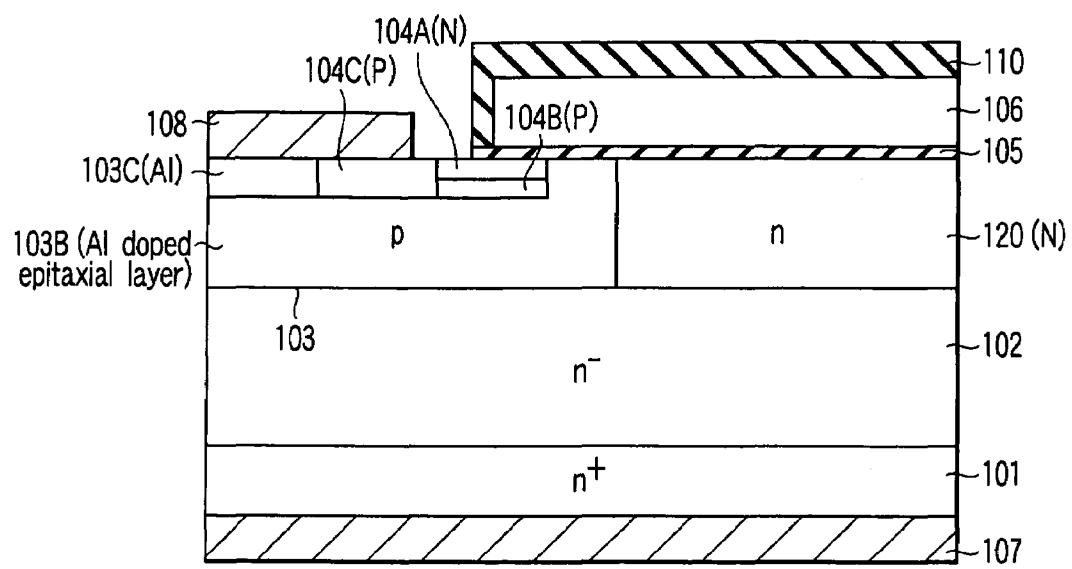
FIG. 14 is a sectional view of the semiconductor device according to a fifth modification of the first embodiment.

FIG. 14 is a sectional view of the fifth modification of the first embodiment. This configuration is characterized in that the p-type base region 103 is formed by epitaxial growth. It is known that the resistance of the inverted layer channel formed on the epitaxial layer is smaller than that formed on the ion-implanted layer. Therefore, the adoption of this configuration can realize a MOSFET having a very low on resistance. In this case, there is no defect caused by ion implantation nor surface roughness, so that in the base region 103 in FIG. 12, the sub-areas 103A and 103D can be formed with Al. Therefore, the p-type base region 103 is configured by the sub-area 103B (Al epitaxial layer) and sub-area 103C (Al ion-implanted layer).

Figure 15:
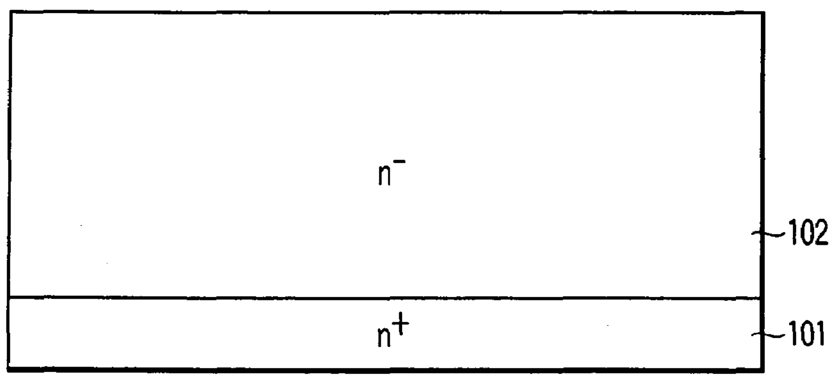
Figure 16:
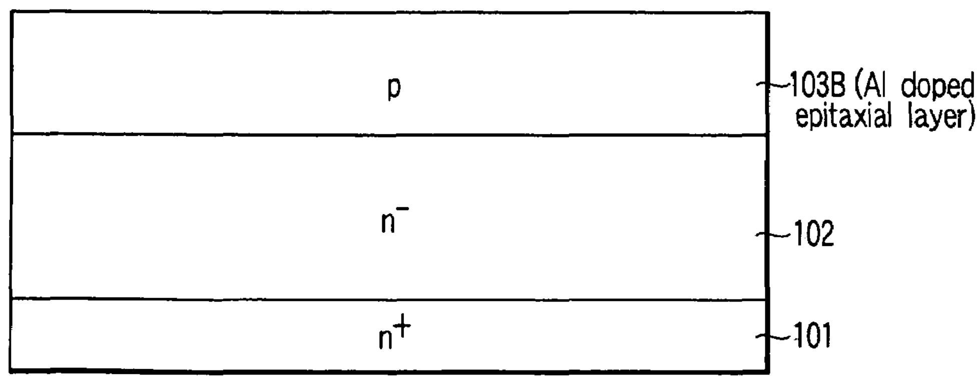

Next, a method of manufacturing this fifth modification using epitaxial growth will be described. First, as shown in FIG. 15, a high-resistance SiC layer 102 is formed on a low-resistance SiC substrate 101 by an epitaxial growth process. The SiC substrate contains nitrogen as n-type impurities in an impurity concentration of $5\times10^{18}$ to $1\times10^{19}/cm^3$, has a thickness of 300 μm, and has hexagonal crystal gratings. The SiC layer contains nitrogen (N) as the n-type impurities in an impurity concentration of about $5\times10^{15}$ to $2\times10^{16}/cm^3$, and has a thickness of 5 to 10 μm. Additionally, nitrogen (N) is used as the n-type impurity here, but other impurities such as phosphorus (P) may be used. Moreover, nitrogen and phosphorus may be used at the same time.

Next, aluminum (Al) is added into the surface of the SiC layer 102, and the base region 103B including the p-type impurities is formed by epitaxial growth. During the growth of the base region 103B, Al addition amount may be changed with time. In this case, the resistance of the base region 103B, the gate threshold voltage and so forth can be set to be a predetermined value.

Next, the surface of the second conductivity type layer 103B(Al-doped epitaxial layer) is spin-coated with a first resist (not shown), and the resist is patterned by a photolithography technology. Nitrogen (N) ions are implanted using the patterned resist as a mask, and a n-type third SiC area 120 is formed. Since the p-type area is converted into the n-type area, the concentration of N is made higher than that of Al in the base region 103B (Al-doped epitaxial layer).

Next, a source region 104 is selectively formed in the base sub-area 103B(Al-doped epitaxial layer) by the ion implantation in the same manner as in the first embodiment. A surface portion 103C(Al-ion implanted layer) brought into contact with a source electrode 108 later in the base sub-area 103B(Al-doped epitaxial layer) is formed to have a high Al concentration in order to achieve a satisfactory contact with the source electrode 108.

Next, as shown in FIG. 17, a gate insulating film 105 is selectively formed in such a manner as to extend over the third SiC area 120, the base sub-area 103B(Al-doped epitaxial layer), and the first source sub-region 104A of the source region 104 by a thermal oxidation process, a CVD process or the like. In this case, nitrogen (N) having a small mass number is added as the n-type impurities to the first source sub-region 104A brought into direct contact with the gate insulating film 105, and accordingly surface roughness of the source region 104 is inhibited, when high-temperature treatment is performed. Similarly, the base sub-area 103B(Al-doped epitaxial layer) is formed by the epitaxial growth method which generates no remnant defects nor surface roughness, and the SiC region 120 is also formed by ion implantation of nitrogen (N), as an n-type impurities, whose mass number is small, so that the surface roughness of the base region 103 due to the high-temperature treatment is inhibited. Therefore, the flat and dense gate insulating film 105 can be formed on the first source sub-region 104A, the base sub-area 103B (Al-doped epitaxial layer) and the SiC layer 120, and long-term reliability of the gate insulating film 105 can be largely improved.

Moreover, as shown in FIG. 18, a polysilicon layer is formed on the gate insulating film 105 by the CVD process, and the polysilicon layer is patterned by lithography and an RIE process to thereby form a gate electrode 106. Thereafter, a silicon oxide film 110 is formed on the gate electrode 106 by surface oxidation and CVD.

Next, a drain electrode 107 and the source electrode 108 are selectively formed by an Ni film in the same manner as in the first embodiment. As described above, a DIMOSFET is completed according to the fifth modification of the first embodiment shown in FIG. 19.

It is to be noted that the above-described fourth modification is also applicable to IGBT. In the IGBT, as shown in FIG. 20, a conductivity type of an SiC substrate 130 is set to a p-type, and an n-type SiC layer 102 may be epitaxially grown via an n-type layer 131. As another manufacturing method, an n-type impurity and p-type impurity may be sequentially ion-implanted from the back surface of the n-type SiC substrate 102.

In the IGBT, when the third silicon carbide region 120 is interposed under the p-type base area 103 as shown in FIG. 20, a special advantage can be produced. That is, in the IGBT, positive holes also contribute to conduction in addition to electrons. The positive holes pass from the drift layer 102 through the p-type base area 103 and a high-concentration p-type contact sub-area 103C, and is discharged to an emitter electrode 108. In the presence of the n-type area 120, an energy barrier is encountered, when the positive holes disposed in the drift layer 102 enter the p-type base area 103. Therefore, the discharge amount of the positive holes into the emitter electrode is reduced, and the positive holes are accumulated in an upper portion of the drift area 102. Accordingly, the on-voltage of the IGBT can be reduced.

Second Embodiment

FIG. 21 is a sectional view showing a configuration of a UMOSFET according to a second embodiment of the present invention. In FIG. 21, an SiC layer 202 including an n-type impurity concentration of about $5\times10^{15}/cm^3$ and having a thickness of about 10 μm is formed on a hexagonal SiC substrate 201 including n-type impurities in an impurity concentration of about $5\times10^{19}/cm^3$. On the partial surface of the SiC layer 202, there is formed a channel region (first silicon carbide region) 203 (generic term of 203B, 203C) whose p-type impurity concentration is about $1\times10^{17}$ to $5\times10^{17}/cm^3$ and which has a thickness of about 2 μm.

Moreover, an n-type source region 204 is formed on this channel region 203B. In more detail, a first source sub-region 204A containing nitrogen as n-type impurity in a range of $1\times10^{18}$ to $1\times10^{20}/cm^3$ is selectively formed. Outside the first source sub-region 204A, there is formed a second source sub-region 204B containing about $1\times10^{20}/cm^3$ of phosphorus (P) as n-type impurity. Each of the first source sub-region 204A and the second source sub-region 204B has a thickness of about 0.5 μm.

A trench 205 having a depth of about 3 μm is formed in such a manner as to extend through the first source sub-region 204A and the channel region 203B and have a bottom portion in the SiC layer 202. A gate insulating film 206 having a thickness of about 80 nm is formed in such a manner as to cover side walls and a bottom surface of this trench 205. A gate electrode 207 is formed of polysilicon containing n-type impurities in a high concentration in such a manner as to fill in the trench 205 via the gate insulating film 206.

A source electrode 208 made of Ni or the like is formed on the surfaces of the first source sub-region 204A, the second source sub-region 204B, and the base sub-area 203C, and a drain electrode 209 is formed on the back surface of the SiC substrate 201.

As described above, according to the semiconductor device of the second embodiment, since nitrogen (N) having a small mass number is added as n-type impurities to the first source sub-region 204A brought into direct contact with the gate insulating film 206 in the same manner as in the first embodiment, the surface of the first source sub-region 204A can be inhibited from being roughened in an interface between the first source sub-region 204A and the gate insulating film 206 in a treatment at a high temperature of around 1600° C. A flat and dense gate insulating film can be realized as a whole, and reliability of the gate insulating film can be greatly improved.

Next, a method of manufacturing the semiconductor device will be described with reference to FIGS. 22 to 25. First, as shown in FIG. 22, on the low-resistance SiC substrate 201 having an impurity concentration of $1\times10^{19}/cm^3$ and a thickness of 300 μm, there are successively formed the n-type high-resistance SiC layer 202 having an impurity concentration of $5\times10^{15}/cm^3$ and a thickness of 10 μm, and the p-type channel region 203 having an impurity concentration of $3\times10^{17}/cm^3$ and a thickness of 2 μm by an epitaxial growth process. Additionally, nitrogen (N) is used as the n-type impurities here, but other impurities such as phosphorus (P) may be used. Moreover, aluminum (Al) is used as p-type impurities, but other impurities such as boron (B) may be used. Both impurities may be used at the same time. The channel region 203 may be selectively formed by ion implantation.

Next, as shown in FIG. 23, nitrogen (N) is selectively ion-implanted in multiple stages into a part of the surface of the channel region 203 on conditions that acceleration energy is 10 to 300 keV and total dosage is $3\times10^{15}/cm^2$. Next, phosphorus (P) is selectively ion-implanted in multiple stages into the surface of the channel region 203 in such a manner as to come in contact with the above-described region on conditions that the acceleration energy is 10 to 400 keV and the total dosage is $7\times10^{15}/cm^2$. Thus, n-type low-resistance first and second source sub-regions 204A(N) and 204B(P) having an impurity concentration of $1\times10^{20}/cm^3$ are formed, respectively, in a region from the surface to a depth of about 0.5 μm. Next, Al is selectively ion-implanted into the surface of the channel region 203, and a base sub-area 203C of a high impurity concentration is formed. Thereafter, the implanted impurities are activated by a thermal treatment of about 1600° C.

Next, as shown in FIG. 24, through anisotropic etching such as RIE and subsequent smoothing treatment in the trench by chemical dry etching (CDE) or the like, the trench 205 is formed which extends through the first source sub-region 204A and whose bottom portion reaches the SiC layer 202. Next, an oxide film 206 is formed on the substrate surface by a thermal oxidation process or a CVD process. Polysilicon to which phosphorus has been added in a high concentration is filled in the trench 205 to form the gate electrode 207. Thereafter, polysilicon is left only in the trench 205 by the RIE or the like, and polysilicon remaining on the first source sub-region 204A(N), the second source sub-region 204B(P) and the base sub-area 203C is removed. Next, the surface of the gate electrode 207 is oxidized to cover the surface of the gate electrode 207 with the oxide film.

Next, after removing the oxide film on a region which will be in contact with an electrode, the source electrode 208 is formed on the gate electrode 207 surface covered with the first source sub-region 204A(N), the second source sub-region 204B(P), a third sub-area 203C(Al) of the channel region, and the oxide film, and the drain electrode 209 is formed on the back surface of the SiC substrate 201 with Ni by an evaporation method accompanying lift-off step. Finally, a sinter treatment is performed, for example, at 950° C. for about five minutes, and a satisfactory ohmic contact is achieved between the source electrode 208 and the drain electrode 209. As described above, the trench gate type UMOSFET is completed as shown in FIG. 25.

In the UMOSFET manufactured as described above, nitrogen having a small mass number is added as n-type impurities to the place of the source region brought into direct contact with the gate insulating film 206, the surface of the source region is inhibited from being roughened in a treatment at a high temperature of around 1600° C., a flat and dense gate insulating film can be realized as on the region surface, and reliability of the gate insulating film can be greatly improved.

Specifically, in a case where the source region brought into direct contact with the gate insulating film is made of phosphorus having a large mass number as shown in FIG. 9 in the same manner as in the first embodiment, a histogram of gate dielectric breakdown is distributed in 0 to 3 MV/cm owing to influences of implantation damages. On the other hand, in a case where the region is made of nitrogen having a small mass number as in the present embodiment, the implantation damages are largely reduced. As a result, the histogram of the gate dielectric breakdown is distributed in 8 to 11 MV/cm, and it is possible to obtain the reliability of the excellent gate insulating film.

Further, when the channel region 203 is formed by an epitaxial method, the resistance of the inversion layer channel is reduced, and a MOSFET having a very low on resistance is realized.

Next, a modification of the second embodiment will be described. FIG. 26 shows a first modification. In the modification, B whose mass number is smaller than that of Al is ion-implanted in a central portion of a channel region 203. Thereafter, a trench 205 is formed also through a first source sub-region 204A formed on the channel region. A channel region exposed in the trench 205 is formed as 203A(B). Therefore, the surface has little roughness, and a satisfactory interface is formed with a gate insulating film 206 formed thereafter. This modification has a similar advantage as in the modifications of the first embodiment. Especially, when the channel region 203 is formed by selective ion-implantation, great advantage is obtained. Further, by adjustment of the impurity concentration in the sub-area 203A(B), the gate threshold voltage of the MOSFET can be set to be a predetermined value.

FIG. 27 is a sectional view showing a second modification of the second embodiment. In the second modification, a fourth sub-area 203D(B) to which B has been added is interposed between an SiC layer 202 and a second sub-area 203B (Al) of a channel layer. This modification has a similar advantage as in the second modification of the first embodiment. Especially, when the channel region 203 is formed by selective ion-implantation, great advantage is obtained.

Figure 28:
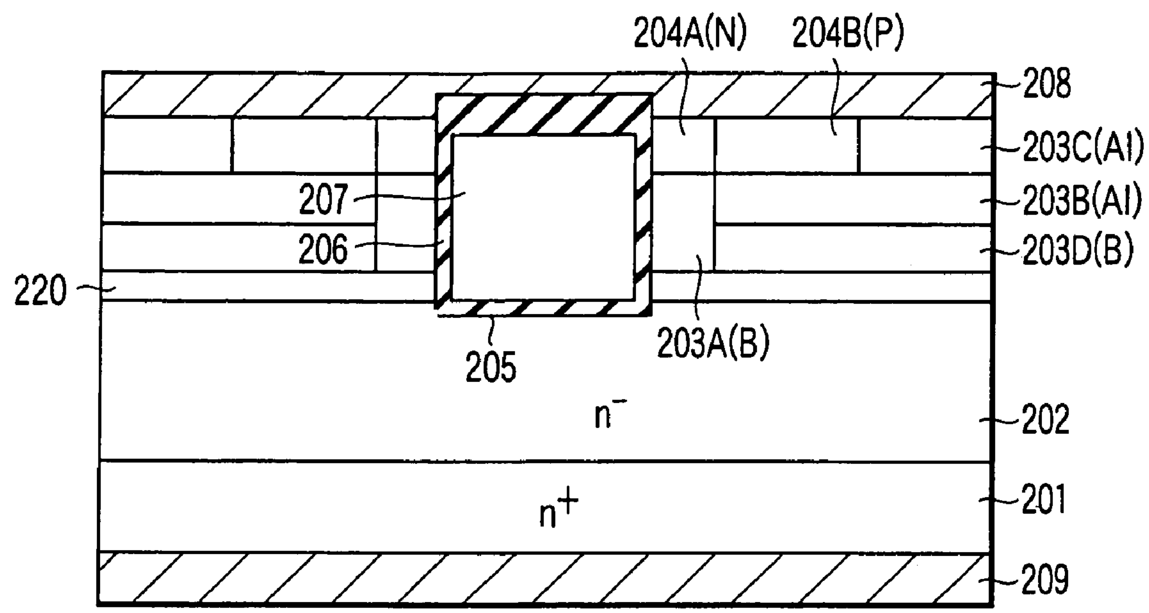
FIG. 28 is a sectional view of the semiconductor device according to a third modification of the second embodiment.

FIG. 28 is a sectional view showing a third modification of the second embodiment. In the third modification, in addition to the second modification, an n-type third silicon carbide region 220 is interposed between an SiC layer 202 and channel layers 203A(B), 203D(B). In this third silicon carbide region, B used in the base sub-area 203A(B), in which an inversion layer channel is formed, is prevented from diffusing in a lower direction by activation annealing, and a channel length is inhibited from being increased.

Moreover, in a trench-type MOSFET, electrons pass from a source region 204A through an inversion layer formed on a gate insulating film interface of the base area 203A, and travel straight through the drift layer 202. In this case, in the drift layer 202, even in a case where an interval between adjacent trench type gate electrodes 207 is broad, the electrons pass through the inversion layer and spread in the n-type region 220 in a lateral direction. When the electrons uniformly flow through the drift layer 202, a function of reducing on resistance is fulfilled. When the channel region 203 is formed by an epitaxial method in the second embodiment, the similar effect is obtained only owing to interposition of the third SiC region 220, without forming the channel layer 203A(B), 203D(B) of the second embodiment configuration. In this case, the gate threshold voltage of the MOSFET can be set to be a predetermined value by addition of the sub-area 203A(B) and control of its impurity concentration.

Figure 29:
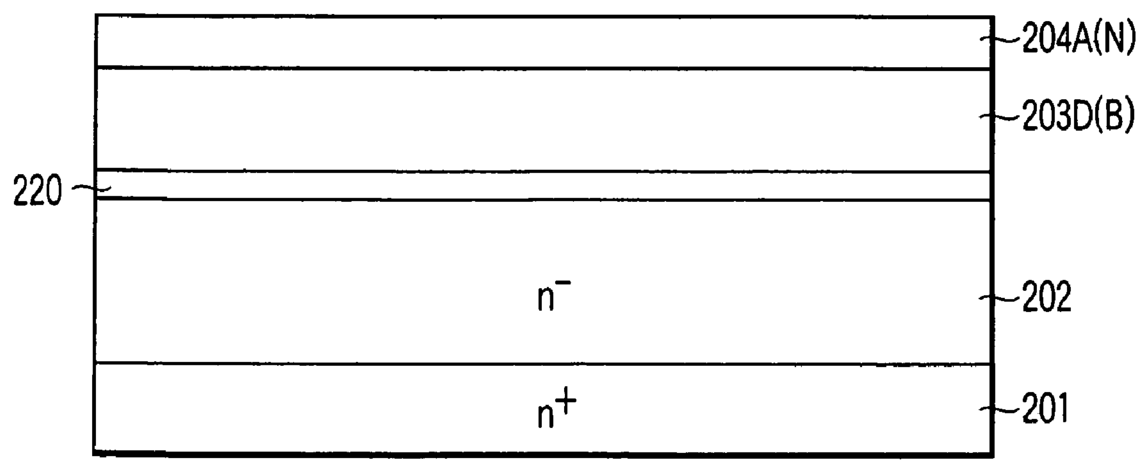

Next, a manufacturing method of the third modification will be described referring to FIGS. 29 to 32. The channel region 203 and source region 204 can be formed by selective ion implantation. However, the manufacturing method including epitaxial growth will be explained in this embodiment. First, as shown in FIG. 29, n-type high-resistance SiC layer 202, n-type SiC layer 220, channel layer 203D(B) to which B has been added, and source layer 204A(N) to which N has been added are successively formed on a low-resistance SiC substrate 201 having an impurity concentration of $1\times10^{19}/cm^3$ and a thickness of 300 μm by an epitaxial process. In the formation of the channel layer 203D, Al may be doped instead of B. Moreover, addition amount of p-type impurities may be changed with time.

Figure 30:
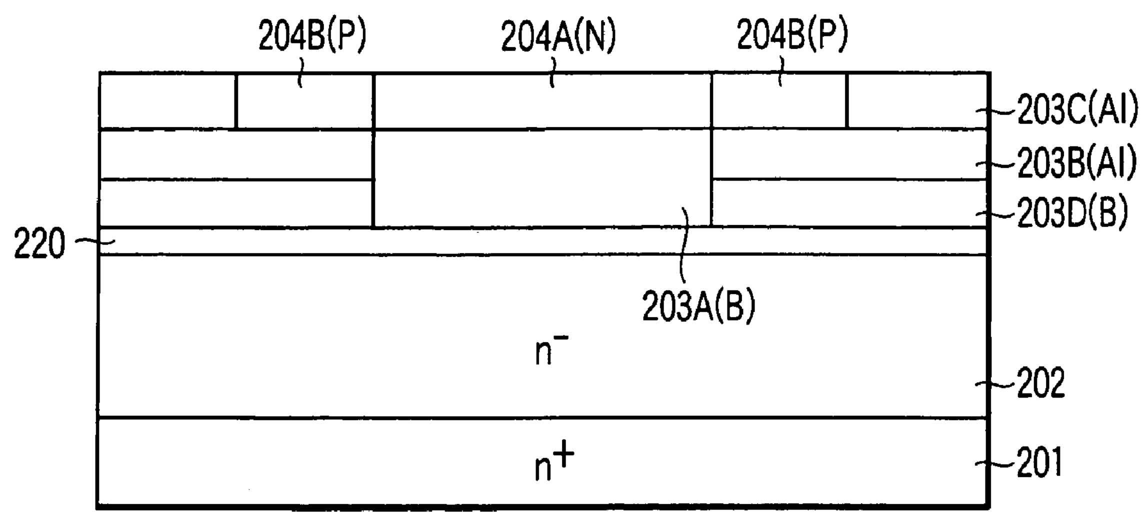

Next, as shown in FIG. 30, regions 203A(B) and 203B(Al) are formed in the channel region 203D(B) by selective multi-stage implantation of B and Al. Furthermore, P and Al are selectively ion-implanted into the source layer 204A(N) to form regions 204B(P) and 203C(Al). Thereafter, the implanted impurities are activated by a heat treatment at about 1600° C.

Figure 31:
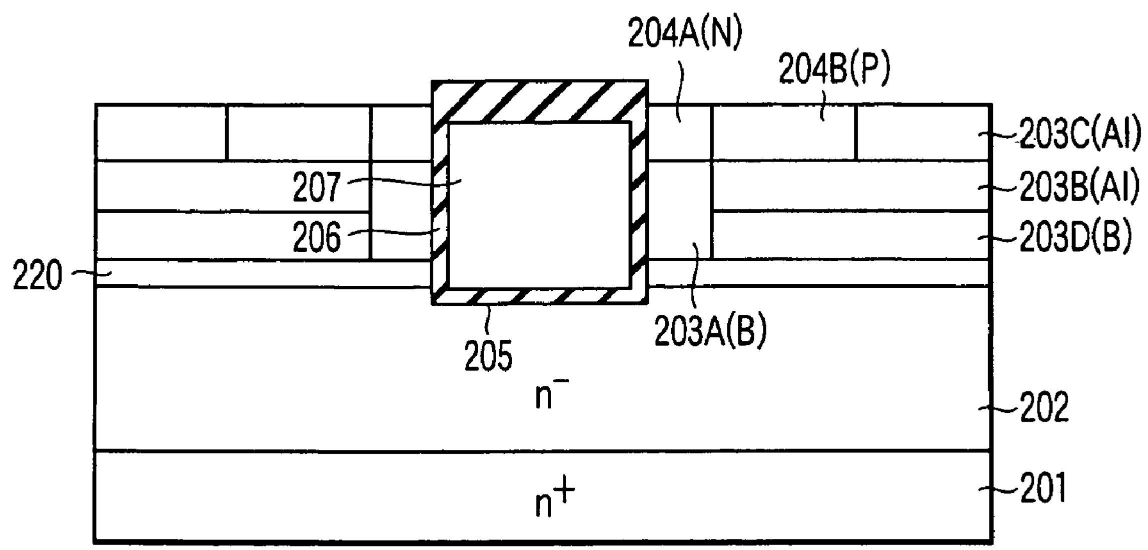

Next, as shown in FIG. 31, through anisotropic etching such as RIE and subsequent smoothing treatment in a trench by chemical dry etching (CDE) or the like, a trench 205 is formed which extends through the source layer (first source sub-region) 204A and whose bottom portion reaches the SiC layer 202. Next, an oxide film 206 is formed on the substrate surface by a thermal oxidation process or a CVD process. Polysilicon to which phosphorus has been added in a high concentration is filled in the trench 205 to form a gate electrode 207. Thereafter, polysilicon is left only in the trench 205 by the RIE or the like, and polysilicon remaining on the first source sub-region 204A(N), the second source sub-region 204B(P) and the base sub-area 203C is removed. Next, the surface of the gate electrode 207 is oxidized to cover the surface of the gate electrode 207 with the oxide film.

Next, after etching off the oxide film on the region to be in contact with an electrode, a source electrode 208 is formed on the first source sub-region 204A(N), second source sub-region 204B(P), base sub-area 203C(Al) and the oxide film, and a drain electrode 209 is formed on the back surface of the SiC substrate 201 by evaporation of Ni accompanying lift-off. Finally, a sinter treatment is performed, for example, at 950° C. for about five minutes, and a satisfactory ohmic contact is achieved between the source electrode 208 and the drain electrode 209. As described above, the manufacturing steps of the trench gate type UMOSFET are completed as shown in FIG. 32.

FIG. 33 is a sectional view of an IGBT in a fourth modification of the second embodiment. In the IGBT, the conductivity type of the SiC substrate 201 of FIG. 28 is changed to p-type, and an $n^-$-type SiC layer 202 is epitaxially grown on the p-type substrate 230 through n-type layer 231. As another manufacturing method, an n-type impurity and a p-type impurity are sequentially implanted from the back side of the p-type substrate 230.

Even in the trench type IGBT, as shown in FIG. 33, when a third silicon carbide region 220 is disposed under a channel region 203, a special effect can be produced. That is, in the IGBT, in addition to electrons, positive holes also contribute to conduction. The positive holes pass from a drift layer 202 through a channel region 203 and a high-concentration contact layer 203C, and are discharged into an emitter electrode 208. In the presence of the n-type region 220, an energy barrier is encountered, when the positive holes disposed in the drift layer 202 enter the p-type base region 203. Therefore, a discharge amount of the positive holes into the emitter electrode is reduced, and the positive holes are accumulated in an upper portion of the drift layer 202. Accordingly, an on-voltage of the IGBT can be reduced.

Third Embodiment

Figure 34:
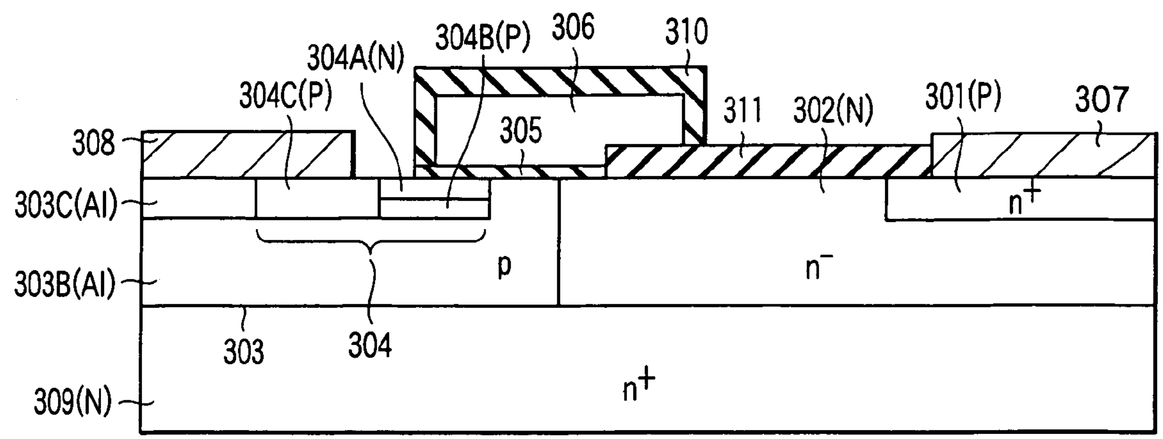
FIG. 34 is a sectional view of the semiconductor device according to a third embodiment of the present invention.

FIG. 34 is a sectional view showing a configuration of a lateral MOSFET according to a third embodiment of the present invention. The embodiment may be basically considered as a lateral type of DIMOSFET of the first embodiment. A p-type base region (first silicon carbide region) 303 and a second silicon carbide region 304 provided in the base region are selectively (on the left side of FIG. 34) formed on an n-type silicon carbide substrate 309(N) to which nitrogen has been added in the same manner as in the first embodiment. A low-concentration third silicon carbide region 302(N) to which nitrogen has been added is formed adjacent to and in contact with this p-type base region 303 on the silicon carbide substrate 309.

As described above, the n-type source region 304 is formed on the surface of the p-type base region 303 in the same manner as in the first embodiment. The n-type source region 304 includes a first source sub-region 304A(N), a second source sub-region 304C(P), and a third source sub-region 304B(P). The second source sub-region 304C(P) contains phosphorus (P) in an impurity concentration range of $1\times10^{18}$ to $1\times10^{20}/cm^3$. Furthermore, a source electrode (first electrode) 308 is formed on the second source sub-region 304C and a high-concentration base sub-area 303C(Al).

An n-type drain region (fourth silicon carbide region) 301P to which P has been added is formed apart from the first silicon carbide region (p-type base region) 303 on the third silicon carbide region 302(N) on the right side in FIG. 33, and a drain electrode (second electrode) 307 is formed on the drain region.

A gate insulating film 305 is selectively formed on upper surfaces of the source sub-region 304A, a p-type base sub-area 303B, and the third silicon carbide region 302, and a gate electrode 306 is formed on the film. An upper surface and side surfaces of the gate electrode 306 are covered with an insulating film 310, and upper surfaces of the third silicon carbide region 302 and the drain region 301 are selectively covered with an insulating film 311.

As described above, according to the semiconductor device of the third embodiment, since nitrogen (N) having a small mass number is added as n-type impurities to the first source sub-region 304A brought into direct contact with the gate insulating film 305 in the same manner as in the first embodiment, the surface of the first source sub-region 304A can be inhibited from being roughened in a treatment at a high temperature of around 1600° C. in an interface between the first source sub-region 304A and the gate insulating film 305. Surface roughness is 10 μm root mean square (RMS) or less, a flat and dense gate insulating film can be realized as a whole, and reliability of the gate insulating film can be greatly improved.

Figure 35:
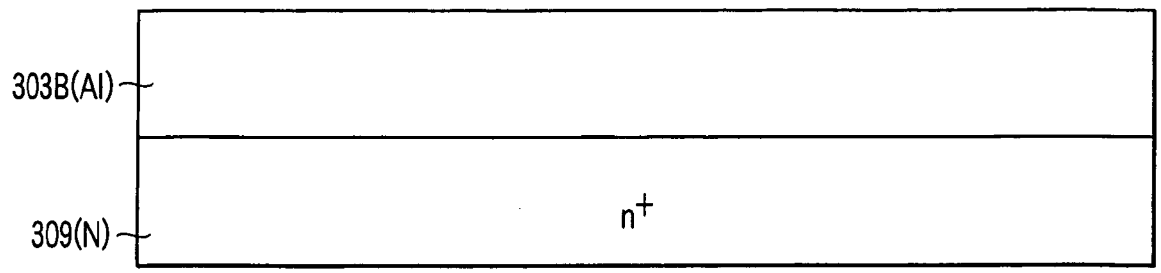

Next, a method of manufacturing the semiconductor device will be described with reference to FIGS. 35 to 38. First, as shown in FIG. 35, an SiC layer 303B(Al) containing aluminum (Al) as p-type impurities is formed on a low-resistance SiC substrate 309 containing nitrogen as n-type impurities by an epitaxial growth process.

Figure 36:
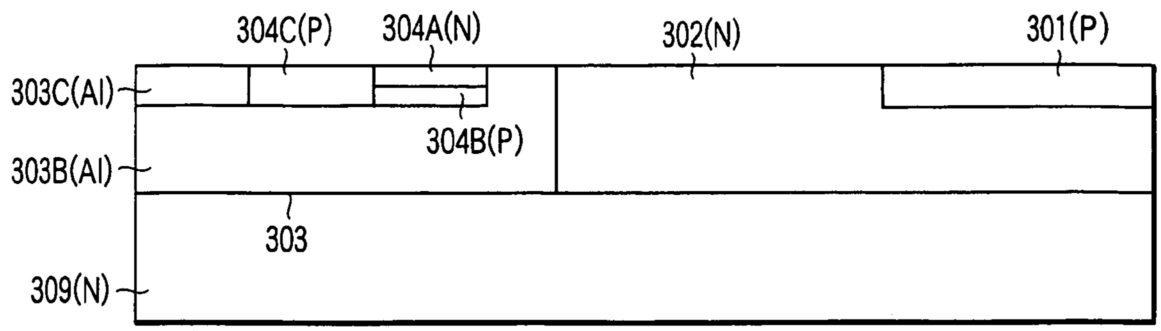

Next, in the same manner as in the first embodiment, a p-type base region 303 is formed on the left side of the SiC layer 303B(Al), as shown in FIG. 36, and nitrogen is ion-implanted on the right side to form an n-type high-resistance low-concentration SiC region 302. A source region 304 (304A, 304B, and 304C) is formed on the upper surface of the p-type base region in the same manner as in the first embodiment. Phosphorous is selectively ion-implanted into the n-type high-resistance low-concentration SiC region 302 to form a drain region 301.

Next, as shown in FIG. 37, a gate insulating film 305 is formed on upper surfaces of the source sub-region 304A, the p-type base region 303, and the third silicon carbide region 302. An insulating film 311 is selectively formed on a part of the upper surfaces of the third silicon carbide region 302 and the drain region 301. A gate electrode 306 is formed of polysilicon on the gate insulating film 305, and an exposed surface is protected by an oxide film 310.

When a source electrode 308 is formed on the second source sub-region 304C and the high-concentration base sub-area 303C(Al), and a drain electrode 307 is formed on the drain region 301(P), the lateral MOSFET shown in FIG. 38 is completed.

In the lateral MOSFET manufactured as described above, nitrogen having a small mass number is added as the n-type impurities to the place in the source region brought into direct contact with the gate insulating film, surface roughness on the source region in a treatment at a high temperature of around 1600° C. is reduced, a flat and dense gate insulating film can be realized on the region, and reliability of the gate insulating film can be largely enhanced.

Even in the third embodiment, various modifications of the first embodiment may be appropriately combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
- a silicon carbide substrate having a first main surface and a second main surface;
- a silicon carbide layer of a first conductivity type disposed on the first main surface of the silicon carbide substrate;
- a first silicon carbide region as a base region of a second conductivity type disposed on a surface of the silicon carbide layer;
- a second silicon carbide region as a source region of the first conductivity type disposed on a surface of the first silicon carbide region so as to be spaced apart inside from all side portions of the first silicon carbide region, and including a first sub-region to which nitrogen is added and a second sub-region which is disposed in such a manner as to come in contact with the first sub-region and to which phosphorus is added;
- a gate insulating film disposed in such a manner as to extend over the silicon carbide layer, the first silicon carbide region, and the first sub-region of the second silicon carbide region above the first main surface of the silicon carbide substrate;
- a gate electrode formed on the gate insulating film;
- a first electrode formed on the second sub-region of the second silicon carbide region and the first silicon carbide region; and
- a second electrode formed on the second main surface of the silicon carbide substrate,
- wherein the second silicon carbide region has a third sub-region sandwiched between a lower surface of the first sub-region and the first silicon carbide region, and phosphorus is added to the third sub-region.

2. The semiconductor device according to claim 1, wherein surface roughness of the first sub-region is less than 10 nm RMS.

3. The semiconductor device according to claim 1, wherein impurity concentration of nitrogen added to the first sub-region is in a range of $1\times10^{18}/cm^3$ to $1\times10^{20}/cm^3$.

4. The semiconductor device according to claim 1, wherein aluminum is added to the first silicon carbide region.

5. The semiconductor device according to claim 1, wherein the silicon carbide substrate is of the first conductivity type.

6. The semiconductor device according to claim 1, wherein the silicon carbide substrate is of the second conductivity type.

7. A semiconductor device comprising:
- a silicon carbide substrate having a first main surface and a second main surface;
- a silicon carbide layer of a first conductivity type disposed on the first main surface of the silicon carbide substrate;
- a first silicon carbide region as a base of a second conductivity type disposed on a surface of the silicon carbide layer;
- a second silicon carbide region as a source of the first conductivity type disposed on a surface of the first silicon carbide region so as to be spaced apart inside from all side portions of the first silicon carbide region, and including a first sub-region to which nitrogen is added and a second sub-region which is disposed in such a manner as to come in contact with the first sub-region and to which phosphorus is added;
- a gate insulating film disposed in such a manner as to extend over the silicon carbide layer, the first silicon carbide region, and the first sub-region of the second silicon carbide region above the first main surface of the silicon carbide substrate;
- a gate electrode formed on the gate insulating film;
- a first electrode formed on the second sub-region of the second silicon carbide region and the first silicon carbide region; and
- a second electrode formed on the second main surface of the silicon carbide substrate,
- wherein the first silicon carbide region comprises:
  - a first sub-area, which is provided on a surface side to be in contact with the gate insulating film and is laterally sandwiched between the first sub-region and the silicon carbide layer, and to which boron is added; and
  - a second sub-area which is disposed in a lower portion of the first sub-area and to which aluminum is added.

8. The semiconductor device according to claim 7, wherein surface roughness of the first sub-region is less than 10 nm RMS.

9. The semiconductor device according to claim 7, wherein impurity concentration of nitrogen added to the first sub-region is in a range of $1\times10^{18}/cm^3$ to $1\times10^{20}/cm^3$.

10. The semiconductor device according to claim 7, wherein the first silicon carbide region further comprises a third sub-area which is disposed between the second sub-area and the silicon carbide layer, and to which boron is added.

11. The semiconductor device according to claim 7, wherein the silicon carbide substrate is of the first conductivity type.

12. The semiconductor device according to claim 7, wherein the silicon carbide substrate is of the second conductivity type.

13. A semiconductor device comprising:
- a silicon carbide substrate having a first main surface and a second main surface;
- a silicon carbide layer of a first conductivity type disposed on the first main surface of the silicon carbide substrate;
- a first silicon carbide region as a base of a second conductivity type disposed on a surface of the silicon carbide layer;
- a second silicon carbide region as a source of the first conductivity type disposed on a surface of the first silicon carbide region so as to be spaced apart inside from all side portions of the first silicon carbide region, and including a first sub-region to which nitrogen is added and a second sub-region which is disposed in such a manner as to come in contact with the first sub-region and to which phosphorus is added;

a gate insulating film disposed in such a manner as to extend over the silicon carbide layer, the first silicon carbide region, and the first sub-region of the second silicon carbide region above the first main surface of the silicon carbide substrate;

a third silicon carbide region disposed between the silicon carbide layer and the gate insulating film in such a manner as to come in contact with the silicon carbide layer, the gate insulating film and a side portion of the first silicon carbide region, an impurity concentration of the third silicon carbide region being higher than that of the silicon carbide layer;

a gate electrode formed on the gate insulating film;

a first electrode formed on the second sub-region of the second silicon carbide region and the first silicon carbide region; and a second electrode formed on the second main surface of the silicon carbide substrate.

14. The semiconductor device according to claim 13, wherein surface roughness of the first sub-region is less than 10 nm RMS.

15. The semiconductor device according to claim 13, wherein impurity concentration of nitrogen added to the first sub-region is in a range of $1\times10^{18}/cm^3$ to $1\times10^{20}/cm^3$.

16. The semiconductor device according to claim 13, wherein aluminum is added to the first silicon carbide region.

17. The semiconductor device according to claim 13, wherein the silicon carbide substrate is of the first conductivity type.

18. The semiconductor device according to claim 13, wherein the silicon carbide substrate is of the second conductivity type.

* * * * *